US008792268B2

(12) United States Patent
Katoh

(10) Patent No.: US 8,792,268 B2
(45) Date of Patent: Jul. 29, 2014

(54) NONVOLATILE LATCH CIRCUIT, NONVOLATILE FLIP-FLOP CIRCUIT, AND NONVOLATILE SIGNAL PROCESSING DEVICE

(71) Applicant: Panasonic Corporation, Osaka (JP)

(72) Inventor: Yoshikazu Katoh, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/881,077

(22) PCT Filed: Nov. 8, 2012

(86) PCT No.: PCT/JP2012/007193
§ 371 (c)(1),
(2), (4) Date: Apr. 23, 2013

(87) PCT Pub. No.: WO2013/076928
PCT Pub. Date: May 30, 2013

(65) Prior Publication Data
US 2014/0078809 A1 Mar. 20, 2014

(30) Foreign Application Priority Data
Nov. 22, 2011 (JP) .................................. 2011-255538

(51) Int. Cl.
*G11C 14/00* (2006.01)
(52) U.S. Cl.
USPC .......................................... 365/154; 365/148
(58) Field of Classification Search
CPC ............................ G11C 14/0081; G11C 14/009
USPC .......... 365/148, 158, 163, 171, 173, 154, 156, 365/185.07, 185.08
See application file for complete search history.

(56) References Cited

U.S. PATENT DOCUMENTS 6,639,834 B2  10/2003  Sunaga et al.
6,862,226 B2   3/2005  Toyoda et al.
(Continued)

FOREIGN PATENT DOCUMENTS

JP    2003-16773    1/2003
JP    2003-157671   5/2003
(Continued)

OTHER PUBLICATIONS

International Search Report issued Dec. 4, 2012 in corresponding International Application No. PCT/JP2012/007193.
(Continued)

*Primary Examiner* — Tha-O H Bui
*Assistant Examiner* — Lance Reidlinger
(74) *Attorney, Agent, or Firm* — Wenderoth, Lind & Ponack, L.L.P.

(57) ABSTRACT

A nonvolatile latch circuit according to the present invention includes: a latch operating unit in which outputs of cross-coupled connected inverter circuit and inverter circuit are connected via a series circuit which includes a transistor, a variable resistance element, and a transistor in this order, and store and restore in a latch state are controlled by control terminals of the transistors; and a comparator circuit which compares a signal obtained by amplifying the value of the sum of potentials at both ends of the variable resistance element with the logic state of the latch operating unit, wherein writing to and reading from the variable resistance element are repeated until an output of the comparator circuit indicates that normal write operation has been performed.

10 Claims, 20 Drawing Sheets

(56) References Cited

U.S. PATENT DOCUMENTS

| | | | |
|---|---|---|---|
| 7,733,145 B2 | 6/2010 | Abe et al. | |
| 8,022,502 B2 | 9/2011 | Kanzawa et al. | |
| 8,437,177 B2 * | 5/2013 | Katoh | 365/154 |
| 8,619,466 B2 * | 12/2013 | Katoh | 365/154 |
| 2002/0181275 A1 | 12/2002 | Sunaga et al. | |
| 2004/0257113 A1 | 12/2004 | Toyoda et al. | |
| 2006/0083047 A1 | 4/2006 | Fujita et al. | |
| 2008/0080231 A1 | 4/2008 | Abe et al. | |
| 2008/0123393 A1 | 5/2008 | Kinoshita | |
| 2009/0283736 A1 | 11/2009 | Kanzawa et al. | |
| 2010/0207094 A1 | 8/2010 | Kanzawa et al. | |
| 2011/0294259 A1 | 12/2011 | Kanzawa et al. | |
| 2012/0069633 A1 | 3/2012 | Katoh | |
| 2012/0280713 A1 * | 11/2012 | Katoh | 326/46 |
| 2013/0107606 A1 * | 5/2013 | Katoh | 365/148 |

FOREIGN PATENT DOCUMENTS

| | | |
|---|---|---|
| JP | 2004-273099 | 9/2004 |
| JP | 2008-85770 | 4/2008 |
| WO | 2004/040582 | 5/2004 |
| WO | 2006/137111 | 12/2006 |
| WO | 2008/149484 | 12/2008 |
| WO | 2009/050833 | 4/2009 |
| WO | 2009/060625 | 5/2009 |
| WO | 2011/121971 | 10/2011 |

OTHER PUBLICATIONS

Wei Wang et al., "Nonvolatile SRAM Cell", 2006 IEEE International Electron Devices Meeting, 10.1109/IEDM.2006.346730 (ISBN: 1-4244-0439-8), Dec. 2006.

* cited by examiner

NONVOLATILE LATCH CIRCUIT, NONVOLATILE FLIP-FLOP CIRCUIT, AND NONVOLATILE SIGNAL PROCESSING DEVICE

TECHNICAL FIELD

The present invention relates to a nonvolatile latch circuit and a nonvolatile flip-flop circuit. Particularly, the present invention relates to a nonvolatile digital signal processing device which can restore a state of signal processing before a power supply is turned off, by a nonvolatile latch circuit restoring the state of the nonvolatile latch circuit which holds the state even when the power supply is turned off.

BACKGROUND ART

A great number of microcomputers and logic LSIs which include a digital circuit are used in electronic products.

In a digital circuit such as a microcomputer or an LSI, a latch circuit which temporarily holds digital signals for intermediate processed content, or a register circuit (hereinafter, collectively referred to as simply latch circuit) such as a flip-flop which stores one bit of digital information is used on a signal processing path. The latch circuit holds two states, high (H) and low (L) of a digital signal. As the simplest circuit configuration, a circuit configuration in which two inverter circuits are combined in a pair and mutually cross-connected to each other can be illustrated. In addition, a set-reset flip-flop (SR-FF) circuit in which two NAND circuits or two NOR circuits are combined in a pair and mutually cross-connected to each other, and an edge-triggered D flip-flop (D-FF) circuit in which a plurality of SR-FF circuits are combined, and the logic state of the output is updated in synchronization with clock edges can be also illustrated. Because these circuits are very ordinary known art, their detailed description is omitted. The operation speeds of the circuits are each determined by a turn-on time and a turn-off time of a transistor. Particularly, in an example of paired inverters, the operation speed is limited only by the switching speed of a C-MOS (Complementary-MOS) circuit including four MOSFETs (Metal Oxide Semiconductor Field Effect Transistor), and thus circuit operation on the order of nano seconds can be assured.

However, once the power source to the latch circuits is turned off, the state of each latch circuit is not held but is lost (volatile). In the case of a nonvolatile latch circuit in which the logic states of all latch circuits in a logic circuit are saved regardless of whether the power source is in ON state or OFF state, the logic states immediately before the turning off of the power source can be quickly restored when the power source is turned on again. Thus even when the power source for an electronic device is turned off by a user, the previous states can be fully restored when the power source is turned on again, thereby allowing continuous circuit operation without returning to the initial state.

Although power saving LSIs have been developed along with the progress of finer semiconductor process, limiting of leakage current has become difficult because of the progress, and thus the power saving LSIs in use of only finer semiconductor process are approaching the limit. For this reason, an approach to improving power saving is being adopted by elaborately controlling turning ON/OFF of the power source per circuit block within an LSI for unused circuit blocks. However, when the power source for a block is turned off, the logic state of the block is lost, and thus the approach cannot be performed on a circuit block for which continuous processing is needed. To the contrary, in the case where the above-described nonvolatile latch circuit constitutes all of the registers and latch circuits in logic circuits, a request for the continuous processing can be satisfied.

However, as an example of application to an LSI of a nonvolatile latch circuit in the conventional art, a floating gate memory element (hereinafter referred to as a flash memory) is utilized as a program recording memory of FPGA (Field-Programmable Gate Arrays) or FPLD (Field-Programmable Logic Devices), and thus the application is limited to a memory area formed as a separate area from a logic circuit. This is because erasing or writing information of or to a flash memory needs a time of the order of micro seconds (μs), and thus the duty cycle of the flash memory cannot be synchronized with the duty cycle of the logic circuit. In the case where such a memory is individually installed in each latch circuit in the logic circuit, even when an operation of each latch circuit is completed, recording of information (logic state of the latch circuit) to the memory is not completed, and thus high-speed operation performance of the logic circuit is impaired. Consequently, in order to ensure high-speed operation of the logic circuit, the following processing is necessary: a flash memory is provided separately from the logic circuit; before the power source is turned off, the state in the logic circuit is transferred to the flash memory; and when the transfer is completed the power source is turned off. However, a problem arises that in the case of a sudden power off, all the latch states in the logic circuit cannot be transferred to the flash memory in time, and thus the recording cannot be completed. The voltage required for writing or erasing of a flash memory is generally substantially higher than the power source voltage of a logic circuit. Therefore, a write operation to the flash memory cannot be directly performed based on an output signal of the logic circuit. Consequently, the writing or erasing voltage of a flash memory needs to be supplied from the outside of an LSI or to be generated inside the LSI chip, and a dedicated driver circuit is necessary.

Furthermore, the manufacturing process of flash memory is complicated in general, and thus forming the logic circuit and the flash memory on the same substrate makes the process even more complicated. In addition, after the transistors that constitute the logic circuit are formed, high-heat process or the like is involved, and therefore the performance of the transistors may be impaired.

In order to cope with these problems, in recent years, the following proposals have been made to configure a nonvolatile latch circuit.

[First Conventional Embodiment]

First, as a first conventional embodiment, a nonvolatile latch circuit using a spin valve memory element as disclosed in PTL 1 is described. The spin valve memory element is also referred to as an MRAM (Magnetic Random Access Memory) cell, which is a memory element using Magneto Resistive Effect in which a resistance value changes in accordance with a magnetization direction. As the Magneto Resistive effect, Anisotropic Magnetoresistance (AMR), Giant Magnetoresistance (GMR), and Tunnel Magnetoresistance (TMR) are known.

FIG. 17A is a circuit configuration diagram of a nonvolatile latch circuit according to the first conventional embodiment. FIG. 17B is an operation timing chart of the nonvolatile latch circuit according to the first conventional embodiment. A nonvolatile latch circuit 600 illustrated FIG. 17A includes a sense latch circuit 601 and a write current generation circuit 602.

The sense latch circuit 601 includes an inverter circuit 611 which includes a p-type MOSFET 621 and an n-type MOSFET 622, an inverter circuit 612 which includes a p-type MOSFET 623 and an n-type MOSFET 624, p-type MOSFETs 625 and 626, an n-type MOSFET 627, and magnetoresistive elements MTJ0 and MTJ1. The write current generation circuit 602 has n-type MOSFETs 628 to 632.

In FIG. 17A, a data is inputted to IN terminal, and inverted data of IN terminal is inputted to IN (with an upper bar) terminal. In this state, when DATAGET terminal is set from "L" to "H" for a predetermined time period, as illustrated in FIG. 17B, the n-type MOSFET 632 is turned on, and a current i flows to DWL in a direction according to the input data. Accordingly, the resistances of the magnetoresistive elements MTJ0 and MTJ1 change, and one of them changes to a high resistance state and the other changes to a low resistance state. Subsequently, when REFRESHN terminal is set from "H" to "L" for a predetermined time period, the n-type MOSFET 627 is turned OFF, and the p-type MOSFETs 625 and 626 are turned ON. Accordingly, a node n1 and a node n2 are temporarily precharged to Vdd. The REFRESHN terminal is then set to "H" again, and the n-type MOSFET 627 is turned ON, and thus a current flows to GND via the magnetoresistive elements MTJ0 and MTJ1. The potentials of the node n1 and the node n2 gradually approach the GND potential because of the current. In this process, one of the magnetoresistive elements MTJ0 and MTJ1 that has less resistance value is discharged earlier and the corresponding node potential is reduced earlier. Consequently, the logic of a pair inverter circuit which includes the inverter circuits 611 and 612 converges, and the latch circuit is restored to the logic state according to the resistance relationship between the magnetoresistive elements MTJ0 and MTJ1.

Like this, PLT 1 states the effect that a nonvolatile latch circuit and a flip-flop circuit can be individually disposed in a logic circuit thanks to the nonvolatile latch circuit 600 using a magnetoresistive element, and the operation speed of the entire logic circuit is not impaired because high-speed rewrite to the magnetoresistive element is possible. PLT 1 also discloses that a high voltage which is different from the voltage necessary for a logic operation in rewriting to a memory element is unnecessary.

[Second Conventional Embodiment]

Next, as a second conventional embodiment, a nonvolatile latch circuit using a ReRAM (Resistive RAM) cell as disclosed in PLT1 is described. The ReRAM cell is a variable resistance element whose resistance value changes under application of an electrical stress (mainly electrical pulse). PLT 1 discloses an element in which a resistance film comprising ZnCdS is interposed between a silver (Ag) electrode and a platinum (Pt) electrode. The variable resistance element in this conventional embodiment changes to a high resistance state under application of a voltage which causes a current to flow from BE (Pt) electrode to TE (Ag) electrode, and exceeds a predetermined voltage level, or changes to a low resistance state under application of a voltage which causes a current to flow from TE (Ag) electrode to BE (Pt) electrode, and exceeds a predetermined voltage level. A nonvolatile latch circuit is configured by connecting the element as illustrated in FIG. 18.

FIG. 18 is a circuit configuration diagram of a nonvolatile latch circuit according to a second conventional embodiment. A nonvolatile latch circuit 700 illustrated in FIG. 20 includes variable resistance elements 711 and 712. The variable resistance element 711 and the variable resistance element 712 must be reset in a high resistance state. In a latch operation at normal operation time, Vctrl is pulled up to Vdd, and the variable resistance elements 711 and 712 are already in a high resistance state regardless of whether BL or BL_B is at the GND level or the Vdd level, and thus no resistance change occurs, and a normal latch operation is performed. Next, when the logic state of the latch circuit is stored in the variable resistance element, Vctrl is set to the GND level for a predetermined time period. Accordingly, the variable resistance element between BL and BL_B that is connected to "H" side changes to a low resistance state. The logic information of the latch circuit which has been stored as a low resistance state is restored in such a manner that when Vctrl is pulled up to Vdd, one of the variable resistance elements which is in a low resistance state is increased in potential earlier than the other variable resistance element, and consequently the side to which the variable resistance element in a low resistance state is connected converges to "H", and the other side converges to "L." In order to return to normal latch operation, it is necessary to reset the variable resistance element in a low resistance state to a high resistance state by increasing the potential of Vctrl terminal higher than Vdd because power consumption increases when a variable resistance element is in a low resistance state.

Thus, according to the example disclosed in PLT 1, a nonvolatile latch circuit can be achieved only by adding two variable resistance elements, and the speed of a normal latch operation is not impaired at all.

[Third Conventional Embodiment]

Next, as a third conventional embodiment, a nonvolatile latch circuit using a ReRAM cell disclosed in PLT 2 and PLT 3 is described.

FIG. 19 is a circuit image diagram illustrating a method of storing the state of a nonvolatile latch circuit according to the third conventional embodiment into a variable resistance element. FIG. 20 is a circuit diagram illustrating a method of restoring the previous latch state based on a resistance state stored in the variable resistance element in the nonvolatile latch circuit according to the third conventional embodiment. In the third conventional embodiment, two variable resistance elements are used as a pair for storing a latch state. A nonvolatile latch circuit 800 illustrated in FIG. 19 is a cross-coupled latch circuit such that an output terminal of an inverter circuit 821 is connected to an input terminal of an inverter circuit 822, and an output terminal of the inverter circuit 822 is connected to an input terminal of the inverter circuit 821. A variable resistance element 811 and a variable resistance element 812 are connected via node x and node y by switching a switch circuit (not shown).

When the nonvolatile latch circuit 800 has a state in which the node x in a High level and the node y is in a Low level, a current flows through the variable resistance elements 811 and 812 in the direction indicated by a voltage application direction A. Then the variable resistance element 811 changes to a state (referred to as HR state, or simply HR) in which a resistance value is high, and the variable resistance element 812 changes to a state (referred to as LR state, or simply LR) in which a resistance value is low.

When the nonvolatile latch circuit 800 has a state in which the node y in a High level and the node x is in a Low level, a current flows through the variable resistance elements 811 and 812 in the direction indicated by a voltage application direction B. Then the variable resistance element 811 changes to LR state and the variable resistance element 812 changes to HR state, and the states of the latch circuits are stored in the respective variable resistance elements.

On the other hand, by switching a switch circuit (not shown), the variable resistance elements 811 and 812 are connected to the power source lines of the inverter circuits 821 and 822 as illustrated in FIG. 20. In this circuit connection, in the case where the variable resistance element 811 is in HR and the variable resistance element 812 is in LR, when the power supply terminal A illustrated in FIG. 22 is pulled up from 0V to the power source voltage VDD, the current flowing through the inverter circuit 821 is reduced, and the current flowing through the inverter circuit 822 is increased. Accordingly, the output of the inverter circuit 821 rises up earlier than the output of the inverter circuit 822, and thus the node y is set to a High level, and the node x approaches a Low level so that the previous latch state is restored. Conversely, in the case where the variable resistance element 811 is in LR and the variable resistance element 812 is in HR, the current flowing through the inverter circuit 821 is increased, and the current flowing through the inverter circuit 822 is reduced. Accordingly, the output of the inverter circuit 822 rises up earlier than the output of the inverter circuit 821, and thus the node x is set to a High level, and the node y approaches a Low level so that the previous latch state is restored.

Thus, according to the configuration of the third conventional embodiment, an effect is obtained that the speed of a normal latch operation is not impaired at all even when a variable resistance element is separated from the latch circuit using a switch circuit. In addition, another effect is obtained that the durability of each variable resistance element can be significantly improved because after a resistance state is read from each variable resistance element, a voltage for causing the previous latch state to be restored is small, and a voltage stress is not applied to the variable resistance element after the restoring.

[Characteristics of Variable Resistance Element]

PTL 4 discloses the characteristic of the cellular structure of a variable resistance element, that is to say, the direction of voltage application and the direction of resistance change are determined as a consequence of configuring the oxide layers included in the variable resistance element in a stacked structure of a first oxide layer having a first oxygen content atomic percentage, and a second oxide layer having an oxygen content atomic percentage which is higher than that of the first oxide layer. PTL 5 discloses that the direction of voltage application and the direction of resistance change are determined as a consequence of utilizing two electrode materials whose standard electrode potentials are respectively high and low, the materials being used for the variable resistance element.

PTL 6 discloses that in some cases, it is necessary to limit the current for stable resistance change operation of a variable resistance element by connecting a load resistance to the variable resistance element in series and switching between the load characteristics of the load resistance in such a manner that the load resistance for changing to LR state is set to be higher than the load resistance for changing to HR state.

PTL 7 describes the possibility of a write failure such that a desired resistance cannot be reached in writing to a variable resistance element, and discloses additional writing after verification in which a write state is verified and additional writing is performed in the case where the write state is abnormal.

CITATION LIST

Patent Literature

[PTL 1] Japanese Unexamined Patent Application Publication No. 7, 2003-157671
[PTL 2] Japanese Unexamined Patent Application Publication No. 2008-85770
[PTL 3] WO 2009/060625
[PTL 4] WO 2008/149484
[PTL 5] WO 2009/050833
[PTL 6] WO 2006/137111
[PTL 7] WO 2011/121971

Non Patent Literature

[NPL 1] "Nonvolatile SRAM Cell", IEEE 2006, 1-4244-0439-8/06

SUMMARY OF INVENTION

Technical Problem

Although, high-speed operation is described as an effect in the nonvolatile latch circuit of PTL 1 quoted as the first conventional embodiment, the speed of circuit operation is lower than that of a normal logic circuit because not only a switching delay of a MOSFET occurs between data input and data output, but also a write operation and a read operation to and from a magnetoresistive effect element are performed. Furthermore, because written information is read from an element, a glitch in which OUT and its inversion OUT (with an upper bar) are both set to "H" level may occur. Such a glitch may cause a malfunction once a logic circuit with synchronized clock is formed, and thus is undesirable. In addition, time division control is necessary, which uses 2 control lines for DATAGET which is a control signal for writing data, and REFRESHN which is a control signal for outputting (reading) data, and thus time allowance for DATAGET and REFRESHN operations needs to be considered, thereby preventing high-speed operation. Furthermore, rewriting to the variable resistance element is performed for each latch operation, and thus there is a concern that life of the variable resistance element may be reduced because of decreased durability for rewriting.

In the nonvolatile latch circuit of PTL 1 quoted as the second conventional embodiment, high-speed operation which is determined by the switching speed of transistors is possible because a circuit element for nonvolatile function has absolutely no influence on a normal latch operation. However, in order to store the state of the latch circuit, it is necessary to perform not only writing of the state to a variable resistance element, and a restore operation for reading the state from the variable resistance element, but also a reset operation for causing all variable resistance elements to change to a high resistance state. In the configuration where data input lines are pulled up by the variable resistance element, data input lines are inserted in the signal lines of all the latch circuits, and a current flows constantly through the data input lines, and thus there is a concern about an increase of power consumption. In order to perform reset operations for a great number of latch circuits at once, a powerful driver circuit is needed, which applies a voltage to a plurality of variable resistance elements in a low resistance state, and causes a current to flow through the variable resistance elements. Furthermore, in a normal latch operation, a voltage of Vdd is constantly applied to a variable resistance element connected to an input terminal at "L" level, and therefore an extremely high stress continues to be applied to the variable resistance element. In general, in a variable resistance element, for example, when a high resistance change voltage continues to be applied, the variable resistance element gradually changes to a higher resistance state than before. Accordingly, even when a voltage for changing the variable resistance element to a low resistance state in order to achieve a low resistance is applied to the variable resistance element subsequently, the variable resistance element is not likely to change to a low resistance state, that is to say, so-called resistance state imprinting phenomenon occurs.

In the latch circuit of PTL 2 and PTL 3 that are quoted as the third conventional embodiment, two variable resistance elements connected in series need to be rewritten, and thus as an application voltage, a voltage obtained by adding a voltage for changing to HR to a voltage for changing to LR is needed, thereby causing an adverse effect, such as an increase in the power source voltage of the latch circuit, and an increase in the number of the power source generation circuits. In a restore operation, when a plurality of latch circuits is powered on simultaneously in order to utilize the transient response in the power on, there is a concern that the power source voltage may be disturbed, which prevents stable restore operation.

Although current limiting needs to be performed in accordance with the direction of rewriting of a variable resistance element depending on the type of the variable resistance element as shown in PTL 6, there is no precedence example in which a specific solution is proposed for current limiting in a resistance change operation in a nonvolatile latch circuit using a variable resistance element. Particularly, in the case of the above-described third conventional embodiment, the amount of voltage distributed to the variable resistance element in HR state is more than the amount of voltage distributed to the other variable resistance element between the two variable resistance elements connected in series. For example, when the variable resistance element 811 is in HR state, and the variable resistance element 812 is in LR state in FIG. 19, most of applied voltage component is allocated to the variable resistance element 811 initially. When the variable resistance element 811 starts to change to LR state, part of the voltage component is distributed to the variable resistance element 812 accordingly. However, while the part of the voltage component is distributed to the variable resistance element 812, the voltage across both ends of the variable resistance element 811 reduces quickly, and a resistance change of the variable resistance element 811 may be interrupted before reaching normal LR state. That is to say, when one variable resistance element changes from HR state to LR state, the other variable resistance element in LR state serves as a load resistance, however, the resistance change to LR state may become unstable because the load resistance of the other variable resistance element also changes.

In the variable resistance element in PTL 7, when the resistance thereof is changed, a failure occurs in rare cases in which a write operation to a desired level cannot be performed. It is desirable to achieve a stable and reliable nonvolatile latch circuit which, even when such a write failure occurs, detects the write failure and performs additional writing after verification for rewriting data, and thus the write failure is restored.

In summary, any of the above-described conventional embodiments has a problem in increasing the speed of latch operation, expanding the life of the variable resistance element, reducing and stabilizing the operating voltage, and thus the above problems cannot be solved at the same time.

The present invention has been conceived in view of the above-mentioned problems, and it is an object of the invention to provide a nonvolatile latch circuit, a nonvolatile flip-flop circuit, and a nonvolatile signal processing device using those circuits which are able to perform storing and restoring of the state of a latch in a stable manner with a high speed and high reliability, Solution to Problem In order to solve the aforementioned problems, a nonvolatile latch circuit according to one aspect of the present invention includes: a latch operating unit including a first logic inversion circuit, and a second logic inversion circuit having an input terminal connected to an output terminal of the first logic inversion circuit and an output terminal connected to an input terminal of the first logic inversion circuit; a first transistor which includes a first terminal, a second terminal, and a first control terminal, and controls a conduction state between the first terminal and the second terminal in accordance with a voltage of the first control terminal; a second transistor which includes a third terminal, a fourth terminal, and a second control terminal, and controls a conduction state between the third terminal and the fourth terminal in accordance with a voltage of the second control terminal; and a variable resistance element having a structure in which an oxide layer comprising a metal oxide is interposed between first and second electrodes, wherein the first terminal of the first transistor and the first electrode of the variable resistance element are connected to each other via a first node, and the fourth terminal of the second transistor and the second electrode of the variable resistance element are connected to each other via a second node, the output terminal of the first logic inversion circuit and the second terminal of the first transistor are connected to each other via a third node, and the output terminal of the second logic inversion circuit and the third terminal of the second transistor are connected to each other via a fourth node, the variable resistance element changes to a first resistance state under application of a first write voltage higher than a first predetermined voltage, between the first electrode and the second electrode so as to cause a current to flow in a direction from the first electrode to the second electrode, and changes to a second resistance state which is higher in resistance value than the first resistance state under application of a second write voltage higher than a second predetermined voltage, between the first electrode and the second electrode so as to cause a current to flow in a direction from the second electrode to the first electrode, and the nonvolatile latch circuit further includes: a summing amplifier circuit which outputs a high-level voltage or a low-level voltage to the latch operating unit according to a value of sum of a potential at the first node and a potential at the second node so as to restore a logic state of the latch operating unit, the potentials being obtained by application of a voltage lower in absolute value than the first voltage and the second voltage to the first control terminal and the second control terminal, and the high-level voltage or the low-level voltage representing a resistance state of the variable resistance element; and a comparator circuit which outputs a high-level voltage or a low-level voltage based on a result of comparison for matching between an output of the summing amplifier circuit and an output of the first logic inversion circuit or the second logic inversion circuit when the summing amplifier circuit does not output the high-level voltage or the low-level voltage to the latch operating unit.

These comprehensive or specific aspects may be achieved as a system, a method, an integrated circuit, a computer program, or a recording medium such as a computer-readable CD-ROM, or as any combination of a system, a method, an integrated circuit, a computer program, and a recording medium.

Advantageous Effects of Invention

According to the configuration of the present invention, a nonvolatile latch circuit and a nonvolatile flip-flop circuit can be arbitrarily disposed in a logic circuit. The operation speed of the entire logic circuit to which the nonvolatile latch circuit and nonvolatile flip-flop circuit of the present invention are applied is only limited by the switching performance of the relevant transistors, and is not impaired at all by adding a nonvolatile function. When logic state information is recorded on a variable resistance element which is a memory element of a nonvolatile latch circuit or a nonvolatile flip-flop circuit, a high voltage which is used for a flash memory is not necessary. In addition, it is possible to check whether or not normal writing has been performed to the variable resistance elements incorporated in all circuit modules, and a write operation is not terminated with a write failure, and thus a desired latch state can be reliably stored. Thus, the present invention provides a highly stable nonvolatile latch circuit, nonvolatile flip-flop circuit, and nonvolatile signal processing device which can maintain stable data storing operation.

DESCRIPTION OF EMBODIMENTS

Figure 1:
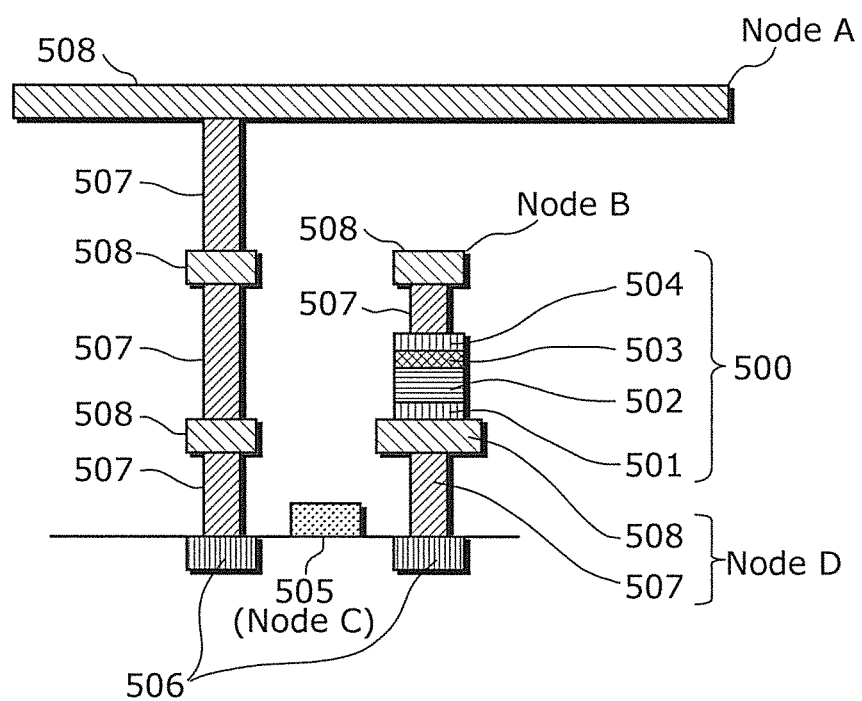
FIG. 1 is an element configuration diagram illustrating an example of the schematic configuration of a variable resistance element having a nonvolatile latch circuit according to Embodiment 1.

Any of the above-described conventional nonvolatile latch circuits cannot solve the following problems at the same time.

Problem 1: the operation speed of each latch operation cannot be as high as the operation speed of a single latch circuit.

Problem 2: the life of each element is short because rewrite to the variable resistance element is performed for each latch operation.

Problem 3: the life of each element is short because voltage application is not made according to a voltage value and a time suitable for rewriting or reading.

Problem 4: the rewriting voltage cannot be reduced because a plurality of variable resistance elements are connected in series and thus application voltage for at least two elements is necessary.

Problem 5: the restore operation is unstable when transition period in which the power source voltage is increased is used in the restore operation.

Problem 6: resistance change process is unstable because current limiting is not performed when a resistance changes.

Problem 7: when the resistance of the variable resistance element is changed, a failure occurs in rare cases in which a write operation to a desired level cannot be performed. When such a write failure occurs, a written resistance state is not at a desired resistance level, and the restore operation for the latch circuit is unstable.

In order to solve the aforementioned problems, a nonvolatile latch circuit according to one aspect of the present invention includes: a latch operating unit including a first logic inversion circuit, and a second logic inversion circuit having an input terminal connected to an output terminal of the first logic inversion circuit and an output terminal connected to an input terminal of the first logic inversion circuit; a first transistor which includes a first terminal, a second terminal, and a first control terminal, and controls a conduction state between the first terminal and the second terminal in accordance with a voltage of the first control terminal; a second transistor which includes a third terminal, a fourth terminal, and a second control terminal, and controls a conduction state between the third terminal and the fourth terminal in accordance with a voltage of the second control terminal; and a variable resistance element having a structure in which an oxide layer comprising a metal oxide is interposed between first and second electrodes, wherein the first terminal of the first transistor and the first electrode of the variable resistance element are connected to each other via a first node, and the fourth terminal of the second transistor and the second electrode of the variable resistance element are connected to each other via a second node, the output terminal of the first logic inversion circuit and the second terminal of the first transistor are connected to each other via a third node, and the output terminal of the second logic inversion circuit and the third terminal of the second transistor are connected to each other via a fourth node, the variable resistance element changes to a first resistance state under application of a first write voltage higher than a first predetermined voltage, between the first electrode and the second electrode so as to cause a current to flow in a direction from the first electrode to the second electrode, and changes to a second resistance state which is higher in resistance value than the first resistance state under application of a second write voltage higher than a second predetermined voltage, between the first electrode and the second electrode so as to cause a current to flow in a direction from the second electrode to the first electrode, and the nonvolatile latch circuit further includes: a summing amplifier circuit which outputs a high-level voltage or a low-level voltage to the latch operating unit according to a value of sum of a potential at the first node and a potential at the second node so as to restore a logic state of the latch operating unit, the potentials being obtained by application of a voltage lower in absolute value than the first voltage and the second voltage to the first control terminal and the second control terminal, and the high-level voltage or the low-level voltage representing a resistance state of the variable resistance element; and a comparator circuit which outputs a high-level voltage or a low-level voltage based on a result of comparison for matching between an output of the summing amplifier circuit and an output of the first logic inversion circuit or the second logic inversion circuit when the summing amplifier circuit does not output the high-level voltage or the low-level voltage to the latch operating unit.

With this configuration, a latch operating unit including a logic inversion circuit, and a state storage unit including a transistor and a variable resistance element are electrically separated from each other by setting the potential of the control terminal of each transistor to the ground potential, for example, so that the above latch operating unit can operate independently of the above state storage unit. Thus, the above-described problem 1 is solved, and the operation speed of each latch operation can be as high as the operation speed of a single latch circuit having no state storage unit. When a writing voltage is applied to the control terminal to drive the variable resistance element under the condition of the logic state of the latch circuit such that the third node (node 1) is at a High level, and the fourth node (node 2) is at a Low level, the first transistor serves as a current limiting element. When a writing voltage is applied to the control terminal to drive the variable resistance element under the condition that the third node (node 1) is at a High level, and the fourth node (node 2) is at a Low level, the second transistor serves as a current limiting element. Consequently, the problem 6 is solved. Because write control can be performed as desired using the control terminal, rewrite to the variable resistance element is not performed for each latch operation, and necessary voltage is applied for a time as needed in rewriting step, and thus stable rewrite operation can be achieved, thereby solving the above-described problem 2 and problem 3. In addition, because a single variable resistance element is used for storing the logic state of each latch circuit, the above-described problem 4 is also solved, and thus the rewriting voltage can be reduced to the lowest level according to a variable resistance element to be used.

In addition, as described in the third conventional embodiment, a transitional period during which power source start-up is unstable is not used when the previous latch state is restored from the resistance state of the variable resistance element, thus the above-described problem 5 is solved. In addition, because a low voltage which has less stress and is necessary for reading is applied for a time as needed, the problem in reading step in the above-described problem 3 is also solved, and thus extremely stable restore operation can be achieved.

Furthermore, when the logic state of the latch circuit is written to the variable resistance element, the second transistor operates as a current limiting element when causing a change to HR state, and the first transistor operates as a current limiting element when causing a change to LR state as described above. In the above process, even when the gate widths of the first transistor and the second transistor are equal, abnormally low resistance value beyond the drive capability of the second transistor can be prevented from being written to the variable resistance element by establishing a relationship that the first write voltage is less than the second write voltage. Therefore, a variable resistance element in LR state can be reliably changed to HR state without changing the resistance in LR state to an excessively low resistance. Consequently, even when the transistors with the gate width are used, the above-described problem 6 is solved, and thus it is possible to provide a nonvolatile latch circuit which stably maintains favorable resistance change operation with extremely high reliability of store operation. In the case where the first write voltage=the second write voltage in the solution of problem 6, a similar effect is obtained by setting the gate width of the first transistor to be smaller than the gate width of the second transistor.

Thus, no write operation is performed when a result of comparison by the comparator circuit indicates matching, and thus the life of the variable resistance element can be increased without giving unnecessary stress to the element, the matching showing the equivalence between the resistance state of the variable resistance element which should represent the current logic state of the latch operating unit, and a changed resistance state after a write operation, the state corresponding to the output of the summing amplifier circuit. When the result of comparison by the comparator circuit indicates non matching, a write operation is repeated until the outputs of the comparator circuit indicate matching, and thus a write failure is restored and problem 7 is also solved, the non matching showing a difference between the resistance state of the variable resistance element which should represent the current logic state of the latch operating unit, and a changed resistance state after a write operation, the state corresponding to the output of the summing amplifier circuit.

In addition, the nonvolatile latch circuit may further includes a first read/write control circuit which (i) prohibits writing when the result of comparison by the comparator circuit indicates matching which shows that the resistance state of the variable resistance element and a changed resistance state of the variable resistance element after writing match, the resistance state representing a current logic state of the latch operating unit and the changed resistance state being an output of the summing amplifier circuit, and (ii) permits writing when the result of comparison by the comparator circuit indicates non matching which shows that the resistance state of the variable resistance element and the changed resistance state of the variable resistance element after writing do not match, the resistance state representing a current logic state of the latch operating unit and the changed resistance state being an output of the summing amplifier circuit.

In such a configuration, even with a plurality of nonvolatile latch circuits, in the order of completion of a normal write operation in the nonvolatile latch circuits, the first read/write control circuit included in corresponding latch circuit prohibits a write operation, and thus the control terminal of each nonvolatile latch circuit can be controlled by a common signal wire, and consequently, wiring can be simplified and the number of wires for the wiring can be reduced.

The summing amplifier circuit may amplify the value of sum and output a high-level voltage or a low-level voltage which represents the resistance state of the variable resistance element, may amplify the value of sum with a first amplification ratio in the case of normal read where a high-level voltage or a low-level voltage representing the resistance state of the variable resistance element is outputted to the latch operating unit to restore the logic state of the latch operating unit from the variable resistance element, and may amplify the value of sum with a second amplification ratio which is different from the first amplification ratio in the case of verification read where a high-level voltage or a low-level voltage representing the resistance state of the variable resistance element is outputted to the comparator circuit to verify the resistance state of the variable resistance element before and after a write operation for changing the resistance state.

In such a configuration, by switching between amplification ratios of the summing amplifier circuit, for example, another resistance value higher than a resistance value, for which a variable resistance element is determined to be in HR state with a first amplification ratio, may be used for determination of HR state. Conversely, another resistance value lower than a resistance value, for which a variable resistance element is determined to be in LR state with a first amplification ratio, may be used for determination of LR state. Therefore, for writing of HR state, writing can be performed with a resistance value sufficiently higher than a specific resistance value used as a threshold value, and for writing of LR state, writing can be performed with a resistance value sufficiently lower than a specific resistance value used as a threshold value. Consequently, even when the resistance value of the variable resistance element deteriorates somewhat due to thermal stress or the like from the outside, a failed restore operation is not performed, and thus a highly reliable nonvolatile latch circuit can be provided.

The oxide layer may include a stacked structure of a first oxide layer comprising a first metal and a second oxide layer comprising a second metal, a degree of oxygen deficiency of the first oxide layer may be greater than a degree of oxygen deficiency of the second oxide layer, the second electrode may be in contact with the second oxide layer, and the first electrode may be in contact with the first oxide layer.

Accordingly, the variable resistance element changes to a high resistance state corresponding to the first resistance value by applying a voltage so as to cause a current to flow in the direction from the second electrode to the first electrode. Conversely, the variable resistance element can change to a low resistance state corresponding to a resistance value lower than the first resistance value by applying a voltage so as to cause a current to flow in the direction from the first electrode to the second electrode.

The first oxide layer may be a first tantalum oxide layer having a composition expressed by $TaO_x$ where $0<x<2.5$.

The second oxide layer may be a second tantalum oxide layer having a composition expressed by $TaO_y$ where $x<y$.

Accordingly, the variable resistance element which is added in order to provide a nonvolatile function is composed of a tantalum oxide. Ta is a proven material that is used in semiconductor process as a nitride TaN, an oxide Ta2O5, or the like. A tantalum oxide can be formed by processing in a room temperature or a relatively low temperature. That is to say, the process of forming the variable resistance element does not involve a heat process that requires a high processing temperature, and thus the performance of transistors is not impaired. In addition, a memory cell array region for recording logic states does not need to be formed separately from a logic circuit region. Consequently, after the transistors that constitute the logic circuit are formed on a semiconductor substrate, a variable resistance element can be formed on part of the wiring layer of plug contact, and thus the integration and fine forming in the logic circuit are not impaired.

The material of the second electrode may be higher in standard electrode potential than the material of the first electrode.

Accordingly, even when a restore operation is performed to restore the state of the latch circuit after writing HR state to the variable resistance element, noise which causes the variable resistance element in HR state to change to LR state does not occur, and thus a nonvolatile latch circuit with high reliability in data storage can be provided.

The nonvolatile latch circuit may further includes: a latch circuit which latches an output of the comparator circuit; and a second read/write control circuit which controls a voltage to be applied to the first control terminal and the second control terminal according to the output of the latch circuit.

In order to solve the aforementioned problems, a nonvolatile flip-flop circuit according to one aspect of the present invention is a clock trigger nonvolatile flip-flop circuit which includes: a first latch circuit which is the above-described nonvolatile latch circuit; a second latch circuit which is connected to the first latch circuit in series, and has both functions of latching an input signal and latching the output signal of the comparator circuit; and a third read/write control circuit which controls writing to the first latch circuit according to a latch signal which is a latched output from the comparator circuit.

In order to solve the aforementioned problems, a nonvolatile signal processing device according to one aspect of the present invention includes N (N is a natural number greater than or equal to 2) pieces of the above-described nonvolatile flip-flop circuits; and a control circuit which combines output signals of the comparator circuits respectively included in the N pieces of the nonvolatile flip-flop circuits, monitors normal completion of write operations to all the variable resistance elements included in the N pieces of the nonvolatile flip-flop circuits, and controls write operations to the variable resistance elements and read operations from the variable resistance elements for the N pieces of the nonvolatile flip-flop circuits.

In the above-described configuration, it is possible to verify whether or not a normal write operation has been performed to each of the variable resistance elements incorporated in all the circuit modules, based on integrated information of the output signals of the comparator circuit of Nth nonvolatile flip-flop circuit module, and a write operation is not terminated with a write failure, and thus a desired latch state of a flip-flop can be reliably stored. In addition, in the order of completion of a normal write operation in the nonvolatile flip-flop circuits, a write pulse inputted from corresponding Ctrl terminal can be automatically blocked, and thus various control signals from the control circuit can be made common for all flip-flops and the number of wires for wiring can be reduced as much as possible. This provides an advantage in that redundant area other than the signal processing circuits serving the original function of the device can be reduced.

Hereinafter, embodiments will be specifically described with reference to the drawings.

Each of the embodiments described below represents a comprehensive or specific example. Numerical values, shapes, materials, components, arrangement positions and connection configurations of the components shown in the following embodiments each provide an example, and are not intended to limit the present invention. Any component not recited in the independent claim out of the components in the following embodiments will be described as an arbitrary component, the independent claim providing the most generic concept.

[Embodiment 1]
[Configuration of Variable Resistance Element]

First, a variable resistance element used in a nonvolatile latch circuit and a flip-flop circuit according to the present invention will be described.

FIG. 1 is an element configuration diagram illustrating an example of the schematic configuration of a variable resistance element having a nonvolatile latch circuit according to Embodiment 1. A variable resistance element 500 illustrated in FIG. 1 is formed on a semiconductor process structure including an ordinary CMOS transistor, and is connected to a semiconductor substrate using, for example, a plug layer 507 on the semiconductor substrate. An MOS transistor including a source-drain region 506 and a gate 505 having a gate oxide layer is formed on the substrate.

The variable resistance element 500 includes a first electrode layer 501 which is a first electrode formed on a metal wiring layer 508, a second electrode layer 504 which is a second electrode, and a first variable resistance layer 502 and a second variable resistance layer 503 that are interposed between the first electrode layer 501 and the second electrode layer 504. In the present embodiment, the first variable resistance layer 502 is a first oxygen-deficient metal oxide layer comprising a first metal, and is, for example, a first tantalum oxide layer having a low oxygen content atomic percentage. The definition of an oxygen-deficient oxide layer is described below. The second variable resistance layer 503 is a second metal oxide layer comprising a second metal, and is, for example, a second tantalum oxide layer which is formed on the above-mentioned first tantalum oxide layer, and has an oxygen content atomic percentage higher than that of the first tantalum oxide layer. By adopting such a configuration, oxidation reduction reaction within the second variable resistance layer 503 is promoted so as to stably cause a change of resistance.

Metal other than tantalum may be used as a constituent of a resistance variable layer. Transition metal or aluminum (Al) may be used as a metallic constituent of a resistance variable layer. The transition metal which can be used includes tantalum (Ta), titanium (Ti), hafnium (Hf), zirconium (Zr), niobium (Nb), tungsten (W), and nickel (Ni). Because a transition metal assumes multiple oxidation states, different resistance states can be achieved by oxidation-reduction reactions.

"Oxygen content atomic percentage" is a ratio of the number of oxygen atoms with respect to the total number of atoms. For example, the oxygen content atomic percentage of $Ta_2O_5$ is $(O/(Ta+O))$ which is the ratio of the number of oxygen atoms with respect to the total number of atoms, and is 71.4 atm %. Therefore, the oxygen content atomic percentage of an oxygen deficient tantalum oxide is greater than 0 and less than 71.4 atm %. For example, in the case where the metal comprised in the first metal oxide layer and the metal comprised in the second metal oxide layer are of the same type, the oxygen content atomic percentages thereof have a corresponding relationship with the degrees of oxygen deficiency. That is to say, when the oxygen content atomic percentage of the second metal oxide is greater than the oxygen content atomic percentage of the first metal oxide, the degree of oxygen deficiency of the second metal oxide is less than the degree of oxygen deficiency of the first metal oxide.

Although the variable resistance element 500 is disposed on the plug layer 507 in FIG. 1, the configuration is not limited to this, and may be changed to an optimal arrangement and shape as needed in accordance with a semiconductor process, or the order of layer arrangement in the structure of the variable resistance element may be changed, or an adhesion layer may be interposed between layers in order to improve the adhesion therebetween.

The material to be used for the first electrode layer 501 and the second electrode layer 504 includes, for example, Pt (platinum), Ir (iridium), Pd (palladium), W (tungsten), Cu (copper), Al (aluminum), TiN (titanium nitride), TaN (nitriding tantalum), TiAlN (titanium nitride aluminum), and the like.

The standard electrode potential of the material of the second electrode layer 504 which is in contact with the second variable resistance layer 503 may be higher than the standard electrode potential of the metal which is comprised in the second variable resistance layer 503. The standard electrode potential of the material of the first electrode layer 501 which is in contact with the first variable resistance layer 502 may be lower than the standard electrode potential of the material of the second electrode layer 504, and may be lower than the standard electrode potential of the metal which is comprised in the first variable resistance layer 502.

This is because a material with a higher standard electrode potential is more resistant to oxidation, and thus oxygen ions can efficiently contribute to oxidation reduction reaction in a variable resistance layer which is in contact with an electrode with a higher standard electrode potential so that stable resistance change is obtained.

Among the above-mentioned electrode materials, the materials having a standard electrode potential higher than that of the metal which constitutes the variable resistance layers are Pt (platinum), Ir (iridium), and Pd (palladium) which are preferable as materials for the second electrode layer 504.

The first electrode layer 501 and the second electrode layer 504 are shaped in the same diameter in FIG. 1, however, the shape is not limited to this, and may be an optimal shape as needed in accordance with a semiconductor process.

For example, a first oxygen-deficient transition metal oxide (e.g., a first oxygen-deficient tantalum oxide) is used as the material for the first variable resistance layer 502. The second metal oxide having an oxygen content atomic percentage higher than that of the first metal oxide is used as the material for the second variable resistance layer 503, for example, a second tantalum oxide is used which has an oxygen content atomic percentage higher than that of the first tantalum oxide. The oxygen-deficient transition metal oxide is an oxide that has an oxygen content atomic percentage (atomic ratio: ratio of the number of oxygen atoms to the total number of atoms) smaller than that of an oxide having a stoichiometric composition. For example, in the case where the metal element is tantalum (Ta), the stoichiometric composition of the oxide is $Ta_2O_5$, which can be expressed as $TaO_{2.5}$. The degree of oxygen deficiency of $TaO_{2.5}$ is 0%, and the degree of oxygen deficiency of $TaO_{1.5}$ is (2.5−1.5/2.5)=40%. A metal oxide having excessive oxygen has a negative degree of oxygen deficiency. Herein, the degree of oxygen deficiency includes a positive value, 0, and a negative value unless specified otherwise. Therefore, in an oxygen-deficient tantalum oxide (hereinafter abbreviated as Ta oxide), the atomic ratio of Ta and O is greater than 0 and less than 2.5. The type of metal element includes, for example, Fe (iron), Zn (zinc), Cr (chromium), nickel (nickel), Ti (titanium), W, Hf (hafnium), and the like, and the stoichiometric composition of the oxide varies depending on the valence of each element.

The first metal that constitutes the first resistance change layer 502, and the second metal that constitutes the second resistance change layer 503 may be different from each other. In this case, the second metal oxide may have a degree of oxygen deficiency lower than that of the first metal oxide, i.e., may have a higher resistance. By adopting such a configuration, a majority of the voltage applied across the first electrode and the second electrode during a resistance change is distributed to the second metal oxide, and thus an oxidation reduction reaction in the second metal oxide is more likely to occur.

When different materials are used for the first metal comprised in the first metal oxide which serves as a first resistance variable layer, and the second metal comprised in the second metal oxide which serves as a second resistance variable layer, the standard electrode potential of the second metal may be lower than the standard electrode potential of the first metal. A higher value of standard electrode potential indicates higher oxidation resistant characteristics. Thus, an oxidation reduction reaction is likely to occur in the second metal oxide having a relatively low standard electrode potential. Resistance change phenomenon probably occurs in the following manner: an oxidation reduction reaction occurs in a tiny local region formed in the second metal oxide having a high resistance, a filament (conductive path) changes, and the resistance value (the degree of oxygen deficiency) changes.

For example, in the case where a first oxygen-deficient tantalum oxide layer ($TaO_x$) having a low oxygen content atomic percentage is used as the first variable resistance layer 502, a titanium oxide layer ($TiO_2$), for example, may be used as the second variable resistance layer 503. Titanium (standard electrode potential=−0.63 eV) is a material having a standard electrode potential lower than that of tantalum (standard electrode potential=−0.6 eV). In this manner, a metal oxide having a standard electrode potential lower than that of the first metal oxide is used for the second metal oxide, and thus an oxidation reduction reaction is likely to occur in the second metal oxide. In this case, the resistance value of the second metal oxide layer which constitutes the second variable resistance layer 503 may be greater than the resistance value of the first metal oxide layer which constitutes the first variable resistance layer 502. When a stacked layer structure is used in which the resistance value of the second metal oxide is higher than the resistance value of the first metal oxide layer, the voltage, which is applied to the variable resistance element at the time of rewriting data, is efficiently applied to the second metal oxide, thereby contributing to a resistance change. The degree of oxygen deficiency of the second metal oxide layer which constitutes the second variable resistance layer 503 may be lower than the degree of oxygen deficiency of the first metal oxide layer which constitutes the first variable resistance layer 502.

Here, "degree of oxygen deficiency" of a metal oxide indicates a ratio of deficient amount of oxygen with respect to the amount of oxygen included in an oxide having a stoichiometric composition (the stoichiometric composition having the highest resistance value when a plurality of stoichiometric compositions exist). A metal oxide having a stoichiometric composition is more stable and has a higher resistance value than a metal oxide having a composition other than the stoichiometric composition.

For example, in the case where the metal element is tantalum (Ta), the stoichiometric composition of the oxide is $Ta_2O_5$, which can be expressed as $TaO_{2.5}$. The degree of oxygen deficiency of $TaO_{2.5}$ is 0%, and the degree of oxygen deficiency of $TaO_{1.5}$ is (2.5−1.5/2.5)=40%. A metal oxide having excessive oxygen has a negative degree of oxygen deficiency. Herein, the degree of oxygen deficiency includes a positive value, 0, and a negative value unless specified otherwise. For example, tantalum oxide having a stoichiometric composition is $Ta_2O_5$, and titanium oxide having a stoichiometric composition is $TiO_2$. The degrees of oxygen deficiency of these oxides are 0%. The degrees of oxygen deficiency of Ta and Ti are 100%. An oxide having a low degree of oxygen deficiency is similar to an oxide having a stoichiometric composition, and thus has a high resistance value, whereas an oxide having a high degree of oxygen deficiency is similar to the metal included in the oxide, and thus has a low resistance value.

In addition, the standard electrode potential of the metal comprised in the second variable resistance layer 503 may be lower than the standard electrode potential of the metal comprised in the first variable resistance layer 502. By adopting such a configuration, a voltage needed to cause a resistance change is efficiently applied to the second variable resistance layer 503, and oxidation reduction reaction within the second variable resistance layer 503 is promoted. Thus a change of resistance can be caused in a more stable manner.

In the present embodiment, an oxygen-deficient tantalum oxide (hereinafter referred to as Ta oxide) is used as the oxygen-deficient metal oxide. Furthermore, the first variable resistance layer 502 is the first tantalum oxide layer having a composition expressed by $TaO_x$ where 0<x<2.5, the second variable resistance layer 503 is the second tantalum oxide layer having a composition expressed by $TaO_y$ where x<y, and these two layers forms a stacked structure. In addition to the above-mentioned layers, another layer, for example, a third tantalum oxide layer, another metal oxide layer, or the like which have an oxygen content atomic percentage different from that of the first tantalum oxide layer and the second tantalum oxide layer may be disposed as needed, or the above-mentioned two layers may be doped with a small amount of impurities. Here, $TaO_x$ as the first tantalum oxide layer may satisfy 0.8≤x≤1.9, and TaO$_y$ as the second tantalum oxide layer may satisfy 2.1≤y. The thickness of the first tantalum oxide layer is 5 nm or more and 100 nm or less, while the thickness of the second tantalum oxide layer may be 1 nm or more and 8 nm or less. The thickness of the second tantalum oxide layer may be less than that of the first tantalum oxide layer.

In the variable resistance element 500 configured as described above, the variable resistance element changes to a high resistance state (referred to as HR state or HR) corresponding to the second resistance state by applying a second write voltage higher than a second predetermined voltage so as to cause a current to flow in the direction from the second electrode layer 504 in contact with the second variable resistance layer 503 to the first electrode layer 501 in contact with the first variable resistance layer 502. Conversely, the variable resistance element changes to a low resistance state (referred to as LR state or LR) corresponding to the first resistance state having a resistance value lower than the above-mentioned second resistance state by applying a first write voltage higher than a first predetermined voltage so as to cause a current to flow in the direction from the first electrode 501 to the second electrode layer 504.

In the above-described configuration, the variable resistance element 500 has a very high compatibility with the steps in the semiconductor manufacturing process, and can be easily produced in a subsequent step after a CMOS transistor is produced, and thus integration and fine forming in the logic circuit are not impaired.

[Current-Voltage Characteristics of Variable Resistance Element]

Next, the current-voltage characteristics of the variable resistance element according to the present embodiment are described.

Figure 2A:
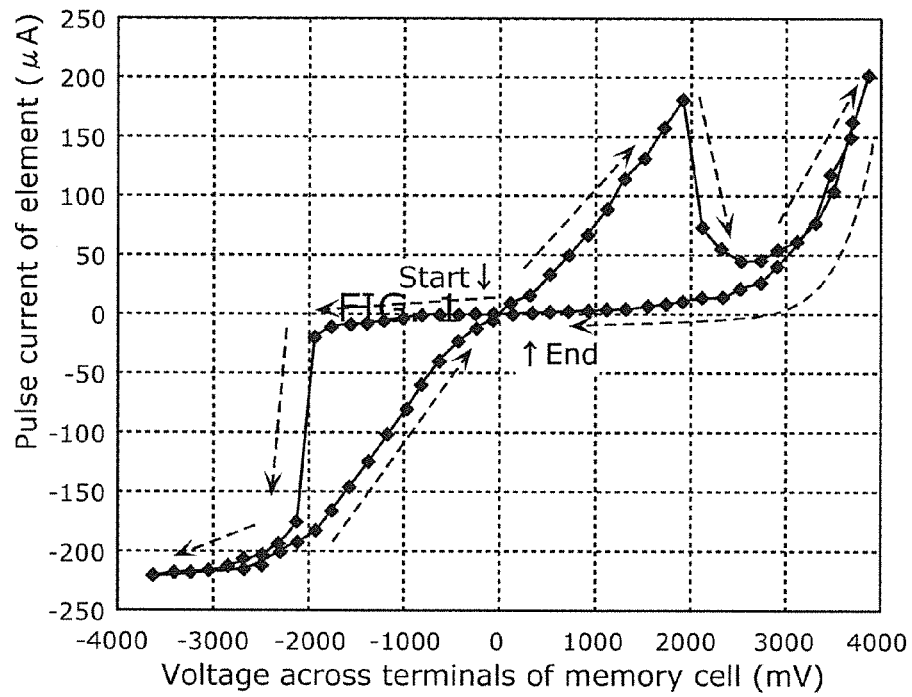
FIG. 2A is a graph illustrating an example of current-voltage characteristics of the variable resistance element according to Embodiment 1.
Figure 2B:
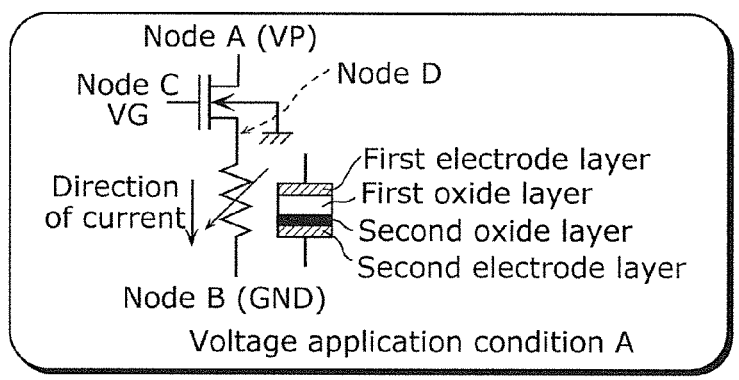
FIG. 2B is a diagram illustrating a voltage application state of negative voltage characteristics in the current-voltage characteristics of the variable resistance element shown in FIG. 2A.
Figure 2C:
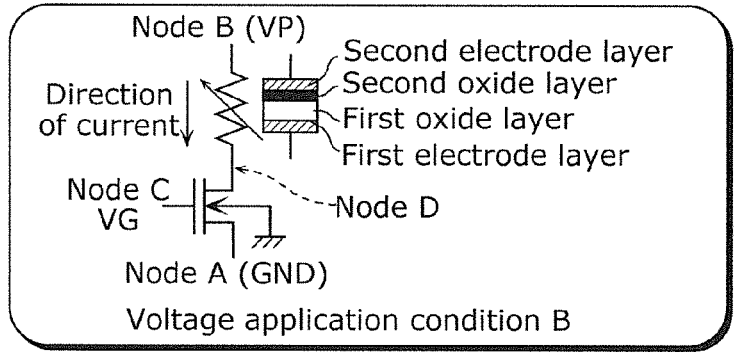
FIG. 2C is a diagram illustrating a voltage application state of positive voltage characteristics in the current-voltage characteristics of the variable resistance element shown in FIG. 2A.

FIG. 2A is a graph illustrating an example of current-voltage characteristics of the variable resistance element according to Embodiment 1. FIG. 2B is a diagram illustrating a voltage application state of negative voltage characteristics in the current-voltage characteristics of the variable resistance element shown in FIG. 2A. FIG. 2C is a diagram illustrating a voltage application state of positive voltage characteristics in the current-voltage characteristics of the variable resistance element shown in FIG. 2A. In the voltage application state A illustrated in FIG. 2B and the voltage application state B illustrated in FIG. 2C, the first electrode layer 501 of the variable resistance element 500 and an N-type MOS transistor are connected in series via node D as illustrated in FIG. 1. As illustrated in FIGS. 2B and 2C, the substrate of the N-type MOS transistor is grounded to the ground level (GND).

In the voltage application state A, i.e., in a state where node B is grounded to GND and a voltage of 4V is applied to the gate terminal of the transistor at node C, a pulse voltage (VP) applied to node A is incremented and decremented by a step amount. The amounts of the pulse voltage and the pulse current in the above steps are each plotted as a negative polarity in FIG. 2A. On the other hand, in the voltage application state B, i.e., in a state where node A is grounded to GND by changing connection-relationship in the voltage application state A with a semiconductor switch or the like, and a voltage of 4V is applied to the gate terminal of the transistor at node C, a pulse voltage (VP) applied to node B is incremented and decremented by a step amount. The amounts of the pulse voltage and the pulse current in the above steps are each plotted as a positive polarity in FIG. 2A.

As illustrated in FIG. 2A, the variable resistance element used in the present invention shows hysteresis characteristics in the current-voltage characteristics. When a positive voltage application is defined as the voltage application which causes a current to flow from the second electrode layer 504 to the first electrode layer 501, and a negative voltage application is defined as the voltage application which causes a current to flow from the first electrode layer 501 to the second electrode layer 504, it can be seen that the positive voltage application causes a resistance change to high resistance state, and the negative voltage application causes a resistance change to low resistance state. Whether the application of polarity of a positive voltage or a negative voltage causes a resistance change to high or low resistance state depends on a variation of the definition, and is not essential in the present invention. That is to say, the variable resistance element used in the present embodiment applies a predetermined voltage level or higher as illustrated in FIG. 2A, and whether the resistance value is increased or decreased is determined by the direction of the current that flows through the variable resistance layer.

[Configuration of Nonvolatile Latch Circuit]

Next, the nonvolatile latch circuit according to Embodiment 1 of the present invention will be described with reference to FIG. 3.

Figure 3:
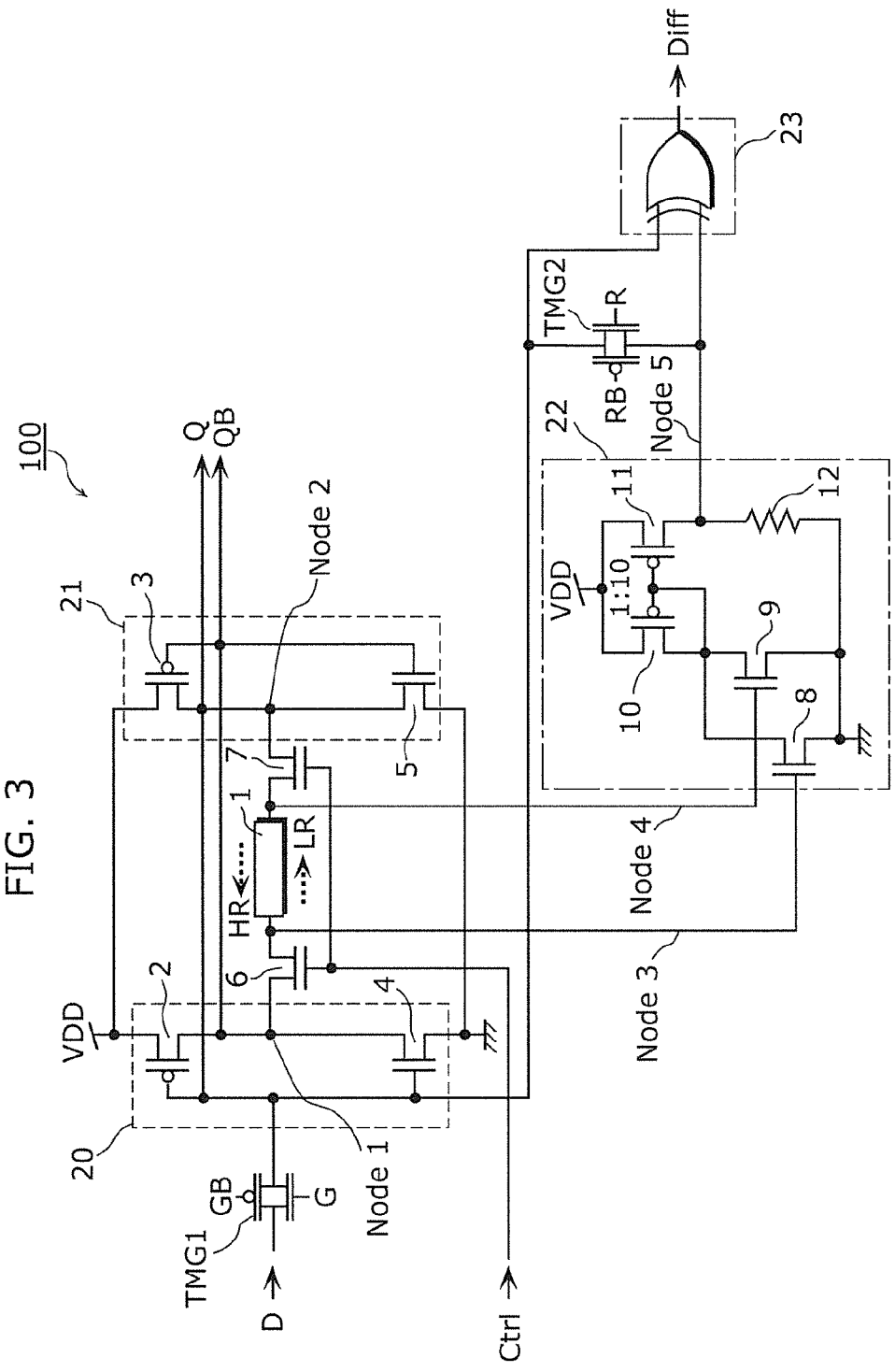
FIG. 3 is a circuit configuration diagram of the nonvolatile latch circuit according to Embodiment 1.

FIG. 3 is a circuit configuration diagram of the nonvolatile latch circuit according to Embodiment 1. A nonvolatile latch circuit 100 illustrated in FIG. 3 includes a variable resistance element 1, transistors 6 and 7, inverter circuits 20 and 21, a summing amplifier circuit 22, a comparator circuit 23, and transmission gates TMG1 and TMG2. The inverter circuit 20 includes transistors 2 and 4, and the inverter circuit 21 includes transistors 3 and 5. The summing amplifier circuit 22 includes transistors 8, 9, 10, 11, and a resistance element 12. The comparator circuit 23 includes an exclusive OR circuit (EX-OR gate).

The transmission gate TMG1 is set to on when the signal level of G terminal is High, or is set to off when the signal level is Low, and an inversion signal at G terminal is inputted to GB terminal. Similarly, the transmission gate TMG2 is set to on when the signal level of R terminal is High, or is set to off when the signal level is Low, and an inversion signal at R terminal is inputted to RB terminal.

The variable resistance element 1 has, for example, the same structure as that of the variable resistance element 500 illustrated in FIG. 1, and has the same characteristics as the current-voltage characteristics illustrated in FIG. 2A.

The transistors 2, 3, 10, and 11 are p-type MOSFETS, for example, and the transistors 4 to 9, and 14 are n-type MOSFETS, for example.

The inverter circuits 20 and 21 are the first logic inversion circuit and the second logic inversion circuit, respectively, and constitute a latch operating unit, where the output terminal of one inverter circuit is cross coupled to the input terminal of the other inverter circuit. The output terminal of the inverter circuit 20 is connected via node 1 to either one of the source terminal and the drain terminal of the transistor 6; the other of the source terminal and the drain terminal of the transistor 6 is connected via node 3 to the first electrode of the variable resistance element 1; the second electrode of the variable resistance element 1 is connected via node 4 to the other of the source terminal and the drain terminal of the transistor 7; and the one of the source terminal and the drain terminal of the transistor 7 is connected via node 2 to the output terminal of the inverter circuit 21. That is to say, the transistor 6, the variable resistance element 1, and the transistor 7 are connected in series in this order, and constitute a state storage unit, and the output terminal of the inverter circuit 20 and the output terminal of the inverter circuit 21 are connected via the series connection.

The first transistor described in the appended claims corresponds to the transistor 6, and the second transistor described in the appended claims corresponds to the transistor 7. The first terminal of the first transistor described in the appended claims corresponds to either one of the source terminal and the drain terminal of the transistor 6, and the second terminal corresponds to the other of the source terminal and the drain terminal of the transistor 6. The first terminal of the second transistor described in the appended claims corresponds to either one of the source terminal and the drain terminal of the transistor 7, and the second terminal corresponds to the other of the source terminal and the drain terminal of the transistor 7. In addition, the third node, the fourth node, the first node, and the second node described in the appended claims correspond to the above-mentioned node 1, node 2, node 3, and node 4, respectively.

The circuit connection is made such that the variable resistance element 1 changes to HR state (second resistance state) by applying a second write voltage higher than the second predetermined voltage so as to cause a current to flow in the direction from node 4 to node 3, and the variable resistance element 1 changes to LR state (first resistance state) by applying a first write voltage higher than the first predetermined voltage so as to cause a current to flow in the direction from node 3 to node 4. A gate voltage applied to the gate terminals which are control terminals of the transistors 6 and 7 can be controlled from Ctrl terminal.

The node 3 and node 4 which are located at both ends of the variable resistance element 1 are connected to the gate terminals of the transistors 8 and 9, respectively; the source terminals of the transistors 8 and 9 are grounded to GND; and the drain terminals of the transistors 8 and 9 are connected to each other. The transistors 10 and 11 form a current mirror circuit, and the mirror ratio is 1:10, for example. That is to say, the current as a composite of the currents flowing through the transistors 8 and 9 is amplified by 10 times and flows through the resistance element 12. The resistance element 12 is illustrated as a fixed resistance for the sake of easy understanding, however, a nonlinear resistance element such as the resistance of a polysilicon which can be manufactured on a substrate by the semiconductor manufacturing process, or on-resistance of a transistor may be used.

In the summing amplifier circuit 22, when a read voltage smaller than the first voltage and the second voltage in absolute value is applied to the gate terminals of the transistors 6 and 7, respective drain currents according to the gate potentials of node 3 and node 4 are added, and the total added current is amplified by the current mirror, and then flows through the resistance element 12. The voltage generated accordingly across the terminals of the resistance element 12 is outputted to the input terminal of the inverter circuit 20 via the node 5 and transmission gate TMG2, thereby restoring the logic state of the latch operating unit including the inverter circuits 20 and 21.

The input terminal of the inverter circuit 20 is connected to one of the input terminals of the comparator circuit 23, and the above-mentioned node 5 is connected to the other of the input terminals of the comparator circuit 23. The logic states of the signals at these two input terminals are compared to each other in a state where the transmission gate TMG2 is OFF, and the comparison result is outputted to Diff terminal which is an output terminal. That is to say, when a high-level voltage or a low-level voltage is not outputted to the latch operating unit by the summing amplifier circuit 22, the comparator circuit 23 outputs a high-level voltage or a low-level voltage based on a result of matching comparison between the outputs of the summing amplifier circuit 22 and the latch operating unit.

Figure 4:
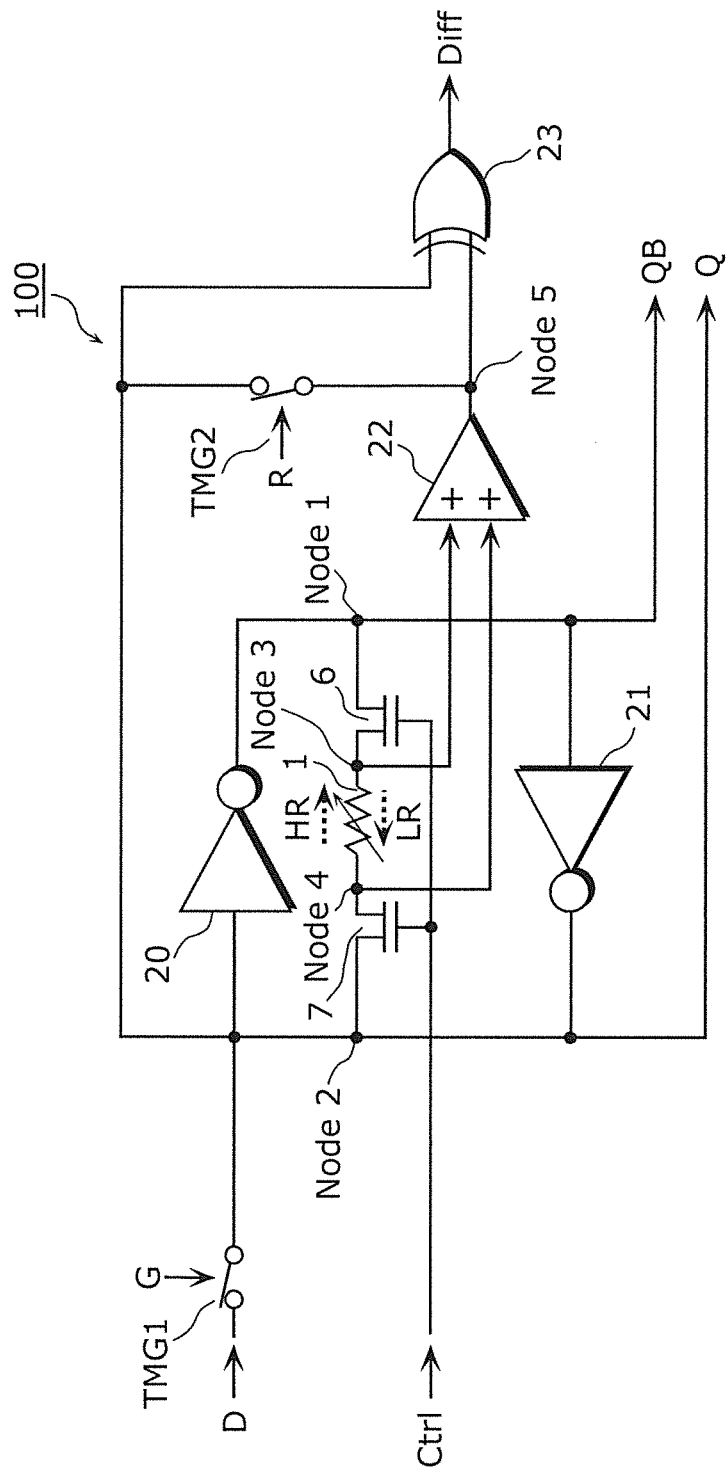
FIG. 4 is a block configuration diagram of the nonvolatile latch circuit according to Embodiment 1.

FIG. 4 is a block configuration diagram of the nonvolatile latch circuit according to Embodiment 1. This configuration diagram is expressed as a simplified block diagram of the circuit diagram of the nonvolatile latch circuit 100 illustrated in FIG. 3, and the components labeled with the same symbols are the same in both diagrams.

Next, the operation of nonvolatile latch circuit 100 according to the present embodiment is described sequentially.

[Latch Operation]

First, by a latch operation of the nonvolatile latch circuit 100, the signal levels at Ctrl terminal and R terminal of the transmission gate TMG2 are set to Low (GND level) in FIG. 3 and FIG. 4 (RB terminal and terminal FB are set to VDD). Accordingly, the transistors 6 and 7, and the transmission gate TMG2 become off, and thus the variable resistance element 1 and the summing amplifier circuit 22 are separated from the latch operating unit which is comprised of the inverter circuits 20 and 21 so that the latch operating unit operates as an ordinary cross-coupled latch circuit.

That is to say, because attached circuits needed for the variable resistance elements and nonvolatile operations have absolutely no influence on a latch operation, the latch operation can be performed at nearly the operation speed of MOSFET which is a component of the latch operation section without reducing the operation speed of the latch operation. In addition, a current constantly flowing through the variable resistance elements is eliminated, and thus the characteristics of low power consumption of the latch operating unit including CMOS circuits are not impaired. Furthermore, a stress is not applied to each variable resistance element by the latch operation, and thus there is no degradation factor for the variable resistance element either. The above latch operating unit can also operate as a clock-synchronized D-latch circuit by inputting a clock signal (CLK) for synchronization to G terminal of the transmission gate TMG1, and inputting an inversion signal of the CLK to GB terminal.

[Store Operation]

Figure 5A:
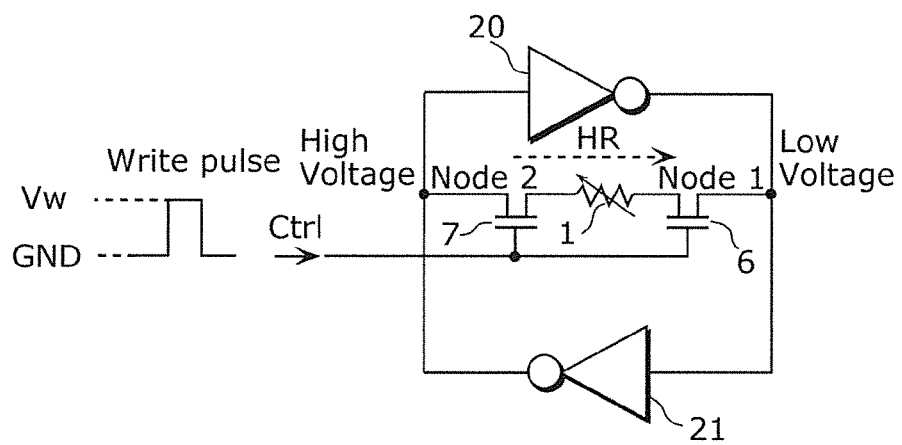
FIG. 5A is a diagram illustrating writing of HR state in a write (store) operation of the nonvolatile latch circuit according to Embodiment 1.

Next, the store operation of the latch state which is one of the characteristics of the present invention, i.e., the write operation of information to a variable resistance element will be described with reference to FIGS. 5A to 7. In FIGS. 5A to 66, the components labeled with the same symbols as those in FIGS. 3 and 4 indicate the same components.

Figure 5B:
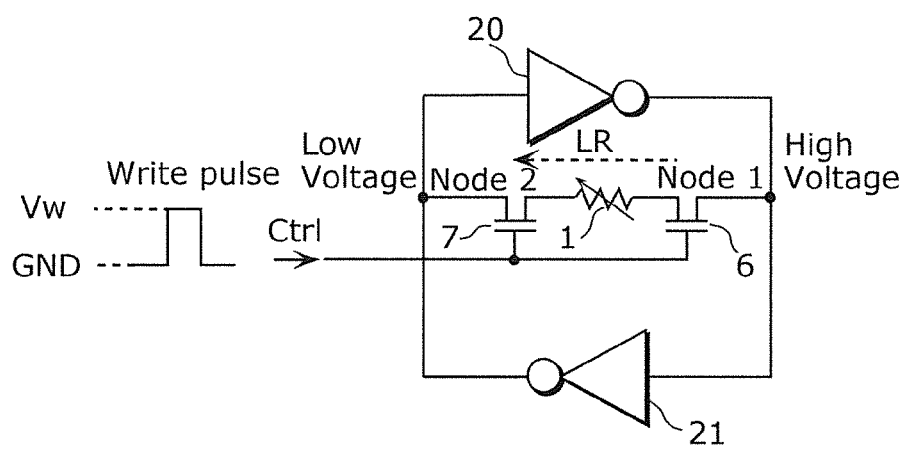
FIG. 5B is a diagram illustrating writing of LR state in a write (store) operation of the nonvolatile latch circuit according to Embodiment 1.

FIG. 5A is a diagram illustrating writing of HR state in a write (store) operation of the nonvolatile latch circuit according to Embodiment 1, FIG. 56 is a diagram illustrating writing of LR state. Specifically, FIG. 5A illustrates a state where node 1 is latched to a Low voltage and node 2 is latched to a High voltage in the nonvolatile latch circuit according to Embodiment 1. FIG. 5B illustrates a state where node 1 is latched to a High voltage and node 2 is latched to a Low voltage. When a write pulse with a voltage amplitude of Vw is applied to the gate terminals of the transistors 6 and 7 from Ctrl terminal in the states illustrated in FIGS. 5A and 56 where the absolute value of the voltage amplitude is larger than that of the first voltage or the second voltage (|Vw|>|first voltage| or |Vw|>|second voltage|), a pulse with a voltage amplitude is applied to the variable resistance element 1 where the voltage amplitude has reduced from Vw by a threshold voltage Vt of the transistors. Consequently, it is more preferable that |Vw| is determined so as to be higher than the voltage amplitude obtained by adding the transistor threshold voltage Vt to the above mentioned |first voltage| or |second voltage|. The above-mentioned write voltage is generated, for example, by a write circuit included in the nonvolatile latch circuit 100, and is outputted to the above-mentioned Ctrl terminal from the write circuit. In the state of node 1 and node 2 illustrated in FIG. 5A, a second current flows in the direction from node 2 to node 1, and the variable resistance element 1 changes to HR state. On the other hand, in the state of node 1 and node 2 illustrated in FIG. 56, a first current flows in the direction from node 1 to node 2, and the variable resistance element 1 changes to LR state.

In the above step, the absolute value of the above-mentioned first current is set to be less than the absolute value of the above-mentioned second current. For example, when writing is performed on the variable resistance element 1 using the transistors 6 and 7 of the same size, the write pulse with the voltage amplitude of Vw, which is applied to the gate terminals of the transistors 6 and 7 may be set as follows.

Under the assumption that the absolute value of the voltage amplitude is Vw1 when the variable resistance element 1 changes from HR state to LR state, and the absolute value of the voltage amplitude is Vw2 when the variable resistance element 1 changes from LR state to HR state, the relationship of Vw1<Vw2 may be satisfied. By adopting such a configuration, the gate widths of the transistor 6 and the transistor 7 can be the same, and the latch circuit can be formed using the minimum-sized transistors.

In the case where writing is performed to the variable resistance element 1 using the write pulse with the same voltage amplitude Vw, the transistors 6 and 7 may be designed so that the relationship of Wa<Wb is satisfied where Wa is the gate width of the transistor 6 and Wb is the gate width of the transistor 7. It should be noted that the gate lengths of the transistors 6 and 7 are the same in the above. By adopting such a configuration, a voltage to be applied is of a single type, and thus the write circuit having a simple configuration can be used. This will be described in detail with reference to FIGS. 6A, 6B, and 7.

Figure 6A:
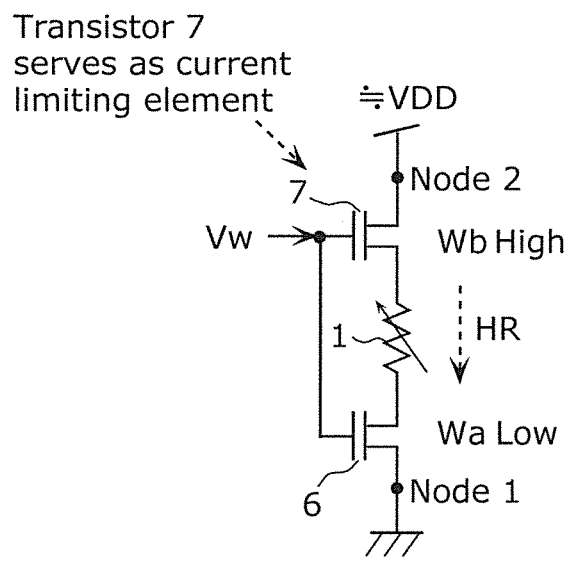
FIG. 6A is a circuit diagram illustrating a write operation to the variable resistance element in voltage application state B in FIG. 2C.
Figure 6B:
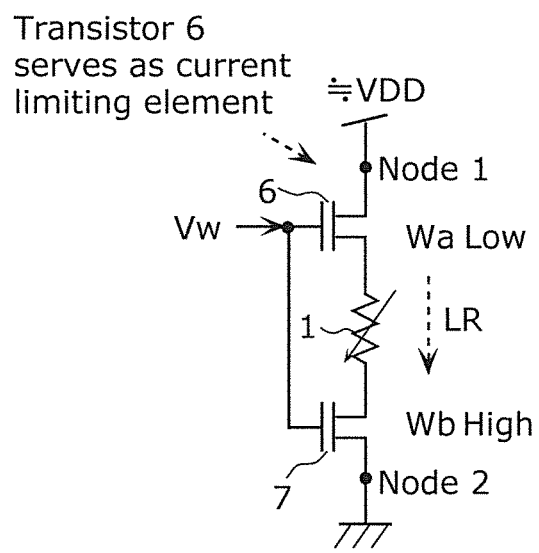
FIG. 6B is a circuit diagram illustrating a write operation to the variable resistance element in voltage application state A in FIG. 2B.
Figure 7:
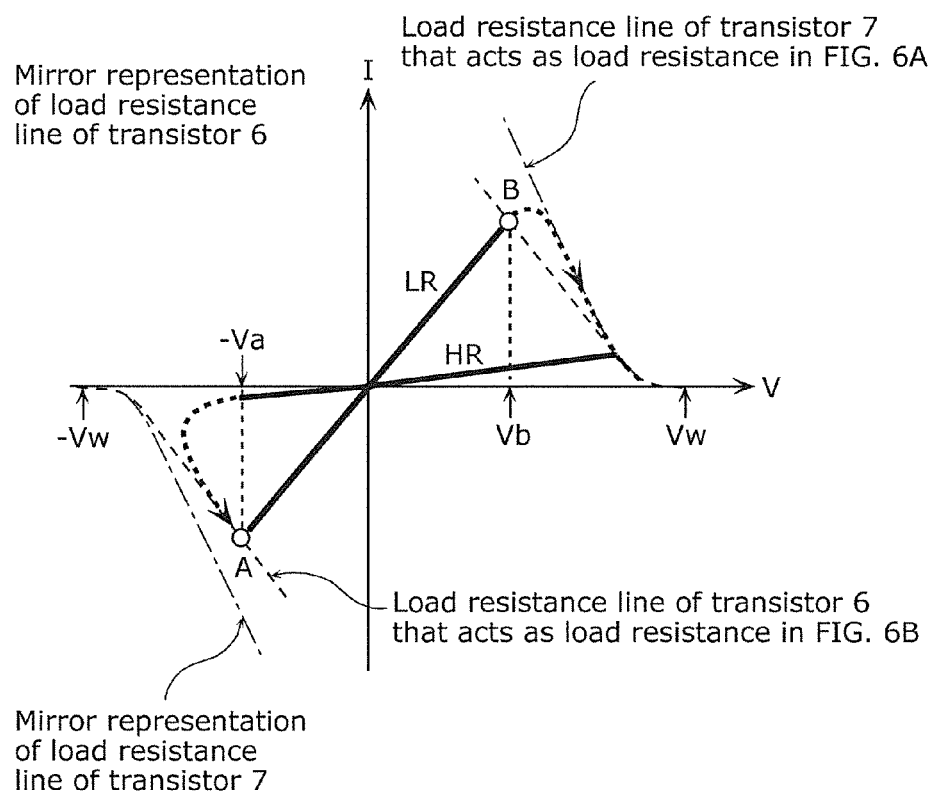
FIG. 7 is a graph in which a load resistance line of each transistor through which current flow is limited is superimposed on the voltage-current characteristics of the variable resistance element.

FIG. 6A is a circuit diagram illustrating a write operation to the variable resistance element in voltage application state B in FIG. 2C, and FIG. 6B is a circuit diagram illustrating a write operation to the variable resistance element in voltage application state A in FIG. 2B. FIG. 7 is a graph in which a load resistance line of each transistor through which current flow is limited is superimposed on the voltage-current characteristics of the variable resistance element.

In FIG. 6A, a value nearly the power source voltage VDD, which corresponds to a High voltage is applied to the drain (node 2) of the transistor 7. On the other hand, a value nearly the ground level (GND), which corresponds to a Low voltage is applied to the source (node 1) of the transistor 6. That is to say, the transistor 7 operates as a source follower circuit of the variable resistance element 1, and therefore, even when the gate width Wb of the transistor 7 is almost the same as or slightly wider than the gate width Wa of the transistor 6, the current drive capability of the transistor 7 becomes lower than that of the transistor 6 which operates with the source being grounded, because of the back bias effect of the transistors. That is to say, in HR state change of the variable resistance element 1 illustrated in FIG. 6A, the current which flows through the element is determined by the drive capability of the transistor 7. On the contrary, in FIG. 66, a value nearly the power source voltage VDD, which corresponds to a High voltage is applied to the drain (node 1) of the transistor 6. On the other hand, a value nearly the ground level (GND), which corresponds to a Low voltage is applied to the source (node 2) of the transistor 7. That is to say, the transistor 6 operates as a source follower circuit of the variable resistance element 1, and therefore, the current drive capability of the transistor 6 becomes lower than that of the transistor 7 which operates with the source being grounded. That is to say, in LR state change of the variable resistance element 1 illustrated in FIG. 66, the current which flows through the variable resistance element 1 is determined by the drive capability of the transistor 6.

As described above, when the variable resistance element 1 is caused to change from LR state to HR state, the voltage level that can be applied to the variable resistance element 1 in LR state is limited by the drive capability of the transistor 7. Conversely, the variable resistance element 1 is caused to change from HR state to LR state, the voltage level that can be applied to the variable resistance element 1 in LR state after the change is limited by the drive capability of the transistor 6.

The current-voltage characteristics in FIG. 7 is illustrated by assuming that the voltage application state in FIG. 6A is positive polarity, and the voltage application state in FIG. 6B is negative polarity. In FIG. 7, when the first predetermined voltage (|Va|) or higher is applied to both ends of the variable resistance element 1 in HR state, the variable resistance element 1 starts to change to LR. The resistance value in LR state in the above step is determined by a load resistance, and change to a low resistance state is stopped at an operating point A which is the intersection point between the load resistance line of the transistor 6 and V=Va so that the resistance value is determined. On the other hand, a change from LR state to HR state starts when the voltage across both ends of the resistance change element 1 exceeds the second predetermined voltage Vb of an operating point B.

In the case of the variable resistance element 1 comprising an oxygen-deficient tantalum oxide which is used in Embodiment 1 of the present invention, the above-mentioned |Va| and |Vb| have an almost equal relationship as the characteristics in FIG. 2A. As described above, when the variable resistance element 1 is caused to change from LR state to HR state, the voltage to be applied to the variable resistance element 1 is determined by the drive capability of the transistor 7, however, a voltage of Vb or higher may be applied to the variable resistance element 1 in LR state by disposing the transistor 7 with a gate width wider than that of the transistor 6. This may be understood by the fact that the slope of the load resistance line of the transistor 7 is greater than that of the mirror representation of the load resistance line of the transistor 6, that is point symmetric to the load resistance line of the transistor 6 around the origin as illustrated in FIG. 7.

As described above, according to the configuration of Embodiment 1 of the present invention, when the logic state of the latch operating unit is written to the variable resistance element 1, the transistor 7 operates as a current limiting element for a change to HR state, and the transistor 6 operates as a current limiting element for a change to LR state. Thus, abnormally low resistance value beyond the drive capability of the transistor 7 can be prevented from being written to the variable resistance element 1 by previously setting the relationship of Wa<Wb between the gate width (Wa) of the transistor 6 and the gate width (Wb) of the transistor 7, and thus the variable resistance element in LR state can be caused to change to HR state without fail. In other words, when the variable resistance element 1 is caused to change from HR state to LR state, or from LR state to HR state, a change to an abnormal LR state in which a change to HR state may not be made can be prevented by increasing the load resistance used for a change to LR state higher than the load resistance used for a change to HR state. Consequently, it is possible to provide a nonvolatile latch circuit which stably maintains favorable resistance change operation with extremely high reliability of store operation.

[Restore Operation]

Next, the restore operation is described, which restores the previous logic state of the latch operating unit from the resistance state stored in the variable resistance element 1.

Figure 8:
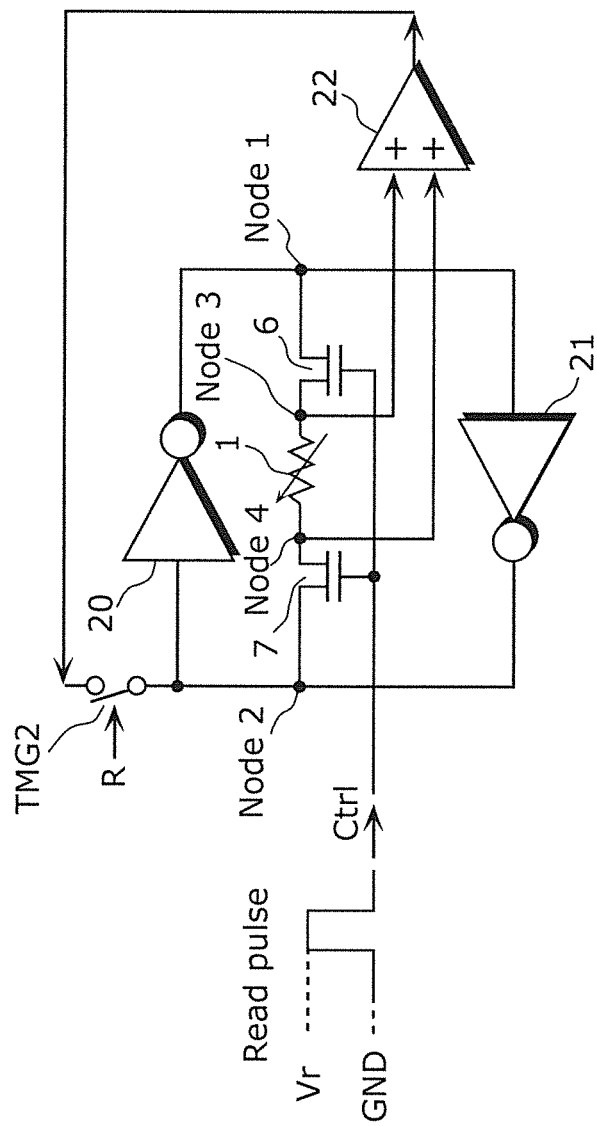
FIG. 8 is a block configuration diagram of a read (restore) operation for restoring a logic state of a latch circuit based on a resistance value stored in the variable resistance element in the nonvolatile latch circuit according to Embodiment 1.

FIG. 8 is a block configuration diagram of a read (restore) operation for restoring a logic state of a latch circuit based on a resistance value stored in the variable resistance element in the nonvolatile latch circuit according to Embodiment 1. Only the part relating to the restore operation in the block configuration illustrated in FIG. 4 is extracted and illustrated in FIG. 8. In the restore operation illustrated in FIG. 8, the transmission gates TMG1 is set to OFF state, and the transmission gate TMG2 is set to ON state.

Normally, when the power source of a latch circuit is turned on, the initial state of the latch circuit is not constantly the same because arrangements of circuit and the relationship of connection to other logic circuits are varied, and loads and capacities are different. That is to say, in the configuration illustrated in FIG. 8, there are two logic states: the case where node 2 is at a High level and node 1 is at a Low level, and the case where node 1 is at a High level and node 2 is at a Low level. For a restore operation, it is desirable that the state of the latch circuit in the previous storing step is restored from the resistance state of the variable resistance element 1 regardless of the logic state of the latch circuit. In order to facilitate the understanding of the restore operation according to the present embodiment, FIGS. 9A to 9D illustrate circuit states for separate cases where node 1 is at a High level, and where node 2 is at a High level.

Figure 9A:
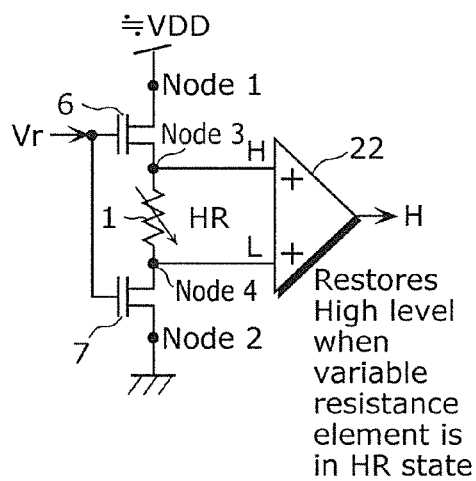
FIG. 9A is a diagram illustrating a read operation when the variable resistance element is in HR state, node 1 is at a High level, and node 2 is at a Low level in the nonvolatile latch circuit according to Embodiment 1.
Figure 9B:
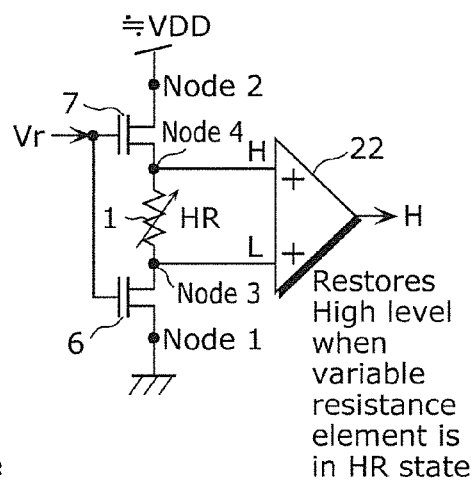
FIG. 9B is a diagram illustrating a read operation when the variable resistance element is in HR state, node 1 is at a Low level, and node 2 is at a High level in the nonvolatile latch circuit according to Embodiment 1.
Figure 9C:
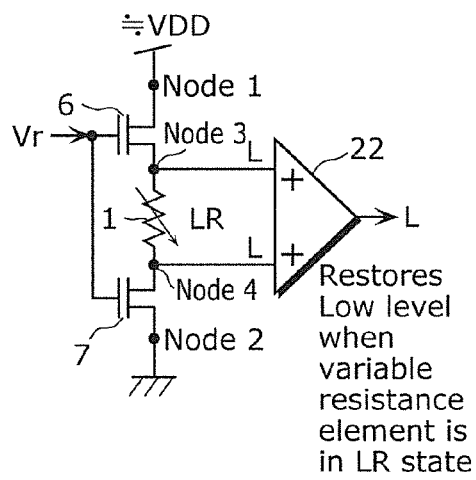
FIG. 9C is a diagram illustrating a read operation when the variable resistance element is in LR state, node 1 is at a High level, and node 2 is at a Low level in the nonvolatile latch circuit according to Embodiment 1.
Figure 9D:
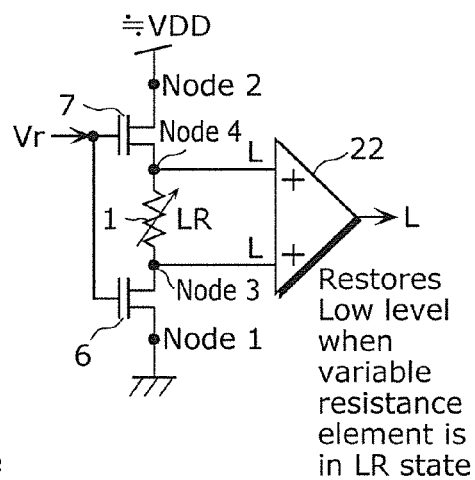
FIG. 9D is a diagram illustrating a read operation when the variable resistance element is in LR state, node 1 is at a Low level, and node 2 is at a High level in the nonvolatile latch circuit according to Embodiment 1.

FIG. 9A is a diagram illustrating a read operation when the variable resistance element is in HR state, node 1 is at a High level, and node 2 is at a Low level in the nonvolatile latch circuit according to Embodiment 1. FIG. 9B is a diagram illustrating a read operation when the variable resistance element is in HR state, node 1 is at a Low level, and node 2 is at a High level. FIG. 9C is a diagram illustrating a read operation when the variable resistance element is in LR state, node 1 is at a High level, and node 2 is at a Low level. FIG. 9D is a diagram illustrating a read operation when the variable resistance element is in LR state, node 1 is at a Low level, and node 2 is at a High level.

First, as illustrated in FIG. 8, at the time of restoring operation, a read pulse with voltage amplitude Vr is inputted from Ctrl terminal, where the absolute value of Vr is smaller than that of the first voltage and the second voltage. For example, specific values in a simulated example demonstrates that when the variable resistance element 1 is such that LR=5 kΩ and HR=100 kΩ, Vr is 1.5V. FIG. 9A indicates the state where node 1 is nearly at the power source voltage VDD corresponding to a High voltage, and node 2 is grounded to the ground (GND) corresponding to a Low voltage. Then, a read pulse with Vr of 1.5 V is applied to the gate terminals of the transistors 6 and 7. Because the variable resistance element 1 is 100 kΩ, which is a high resistance state (HR), node 3 is at a potential which is reduced by the threshold voltage (Vth) of the transistor, and specifically, the potential is 0.67 V. On the other hand, node 4 is at almost ground level, 0V because the transistor 7 operates in a complete on-region.

The potential of node 3 is inputted to the transistor 8 included in the summing amplifier circuit 22, and the potential of node 4 is inputted to the transistor 9 included in the summing amplifier circuit 22. Because the potential of node 3 is 0.67 V, the transistor 8 is set in ON state. Because the potential of node 4 is 0 V, the transistor 9 is set in OFF state. The current which the transistor 8 causes to flow is amplified by the current mirror circuit of the summing amplifier circuit 22 including the transistors 10 and 11. The amplified current flows through, for example, the resistance element 12 which is set to 20 kΩ, and sets the output terminal of the summing amplifier circuit 22 to a High level. Because the output terminal of the summing amplifier circuit 22 is fed back to node 2, node 2 is set to High and node 1 is set to Low so that the previous logic state of the latch circuit is restored.

Similarly, FIG. 9B indicates the state where node 2 is nearly at the power source voltage VDD corresponding to a High voltage, and node 1 is grounded to the ground (GND) corresponding to a Low voltage. Then, similarly to the state in FIG. 9A, a read pulse with Vr of 1.5 V is applied to the gate terminals of the transistors 6 and 7. Because the variable resistance element 1 is 100 kΩ, which is a high resistance state (HR), node 4 is at 0.67 V which has been reduced by the threshold voltage (Vth) of the transistor. On the other hand, node 4 is at almost ground level, 0V because the transistor 6 operates in an entire on-region.

Because the potential of node 4 is 0.67 V, the transistor 9 is set in ON state. Because the potential of node 3 is 0 V, the transistor 9 is set in ON state. The current which the transistor 9 causes to flow is amplified by the current mirror circuit of the summing amplifier circuit 22 including the transistors 10 and 11, and the output terminal of the summing amplifier circuit 22 is set to a High level in the same manner as in FIG. 9A. Because the output terminal of the summing amplifier circuit 22 is fed back to node 2, node 2 is set to High and node 1 is set to Low so that the previous logic state of the latch circuit is restored. That is to say, when the variable resistance element 1 is in HR state, node 2 is set to High and node 1 is set to Low so that the previous logic state of the latch circuit is restored regardless of the current logic state of the latch circuit.

Next, FIG. 9C indicates the state where node 1 is nearly at the power source voltage VDD corresponding to a High voltage, and node 2 is grounded to the ground (GND) corresponding to a Low voltage. Then, a read pulse (Vr) of 1.5 V is applied to the gate terminals of the transistors 6 and 7. Because the variable resistance element 1 is 5 kΩ, which is a low resistance state (LR), the potential at node 3 is reduced by the voltage value obtained by adding a voltage drop caused by the on-resistance of the transistor 6 to the threshold voltage (Vth) of the transistors, and specifically, is reduced to 0.18 V. On the other hand, the potential of node 4 is reduced by a slight voltage drop to be 0.16 V because the on-resistance is not negligible even though the transistor 7 operates in an entire on-region.

Although the potential of node 3 is inputted to the transistor 8 and the potential of node 4 is inputted to the transistor 9, the potentials are less than respective triggering voltages to turn on the transistors 8 and 9, and thus both transistors 8 and 9 are set in OFF state. Consequently, the current which flows through the resistance element 12 is reduced, and the output terminal of the summing amplifier circuit 22 is set at a Low level. Because the output terminal of the summing amplifier circuit 22 is fed back to node 2, node 2 is set to Low and node 1 is set to High so that the previous logic state of the latch circuit is restored.

Similarly, FIG. 9D indicates the state where node 2 is nearly at the power source voltage VDD corresponding to a High voltage, and node 1 is grounded to the ground (GND) corresponding to a Low voltage. Then, a read voltage (Vr) of 1.5 V is applied to the gate terminals of the transistors 6 and 7 similarly to the state in FIG. 9A. Because the variable resistance element 1 is 5 kΩ, which is a low resistance state (LR), the potential at node 4 is reduced by the voltage value obtained by adding a voltage drop caused by the on-resistance of the transistor 7 to the threshold voltage (Vth) of the transistors, and specifically, is reduced to 0.18 V. On the other hand, the potential of node 3 is reduced by a slight voltage drop to be 0.16 V because the on-resistance is not negligible even though the transistor 6 operates in an entire on-region. Although the potential of node 3 is inputted to the transistor 8 and the potential of node 4 is inputted to the transistor 9, the potentials are less than respective triggering voltages to turn on the transistors 8 and 9, and thus both transistors 8 and 9 are set in OFF state. Consequently, the current which flows through the resistance element 12 is reduced, and the output terminal of the summing amplifier circuit 22 is set at a Low level in the same manner as in FIG. 9C. Because the output terminal of the summing amplifier circuit 22 is fed back to node 2, node 2 is set to Low and node 1 is set to High so that the previous logic state of the latch circuit is restored. That is to say, when the variable resistance element 1 is in LR state, node 2 is set to Low and node 1 is set to High so that the previous logic state of the latch circuit is restored regardless of the current logic state of the latch circuit.

That is to say, as illustrated in FIGS. 9A to 9D, there are two types of state of the variable resistance element, i.e., HR and LR, and two types of level of node 1 of the latch circuit, i.e., High level and Low levels, and thus total of four types of combinations exist. When a read voltage (Vr) smaller in absolute value than the voltage which is applied to the gate terminals of the transistors 6 and 7 in rewriting of the resistance state is applied to the gate terminals of the transistors 6 and 7, the summing amplifier circuit 22 outputs a High level or a Low level corresponding to the logic state of the latch operating unit, in accordance with the value obtained by adding the potential of node 3 (the first node) to the potential of node 4 (the second node). Regardless of any combination in the above-mentioned four types of combinations, when the variable resistance element is in HR state, node 1 (the third node) is restored to a Low level, and node 2 (the fourth node) is restored to a High level. On the other hand, when the variable resistance element is in LR state, node 1 (the third node) is restored to a High level, and node 2 (the fourth node) is restored to a Low level. Accordingly, the summing amplifier circuit 22 stably restores the logic state of the latch operating unit including the inverter circuits 20 and 21 from the resistance state stored in the variable resistance element 1.

As described above, the restore operation of the nonvolatile latch circuit according to Embodiment 1 of the present invention is not a restore operation like the conventional art, which uses the power source start-up of the latch circuit. Consequently, in a state where the power source voltage is sufficiently stable, or even when the latch circuit is in operation, the restore operation can be performed in an extremely stable and reliable manner. The specific values of the above-described Vr, the voltage value at each node, and the mirror ratio of a current mirror circuit are just examples, and it is needless to say that these values are optimized in accordance with the characteristics of the variable resistance element 1 and the environmental conditions of the semiconductor process.

[Additional Writing after Verification of Variable Resistance Element]

Next, the process of additional writing after verification which is an important function in Embodiment 1 of the present invention will be described. As described above, a resistance variable element used in the nonvolatile latch circuit and the nonvolatile flip-flop circuit according to the present invention has a very high compatibility with the steps in the semiconductor manufacturing process, and can be easily produced in a subsequent step after a CMOS transistor is produced. In addition, the resistance variable element provides high speed operation, and is highly reliable in data holding characteristics and the upper limit of the number of rewrite. Using these characteristics, a high performance nonvolatile latch circuit can be formed.

However, a write failure occurs in rare cases in which a desired resistance level cannot be achieved in writing of the variable resistance element. This phenomenon will be described with reference to FIG. 10A.

Figure 10A:
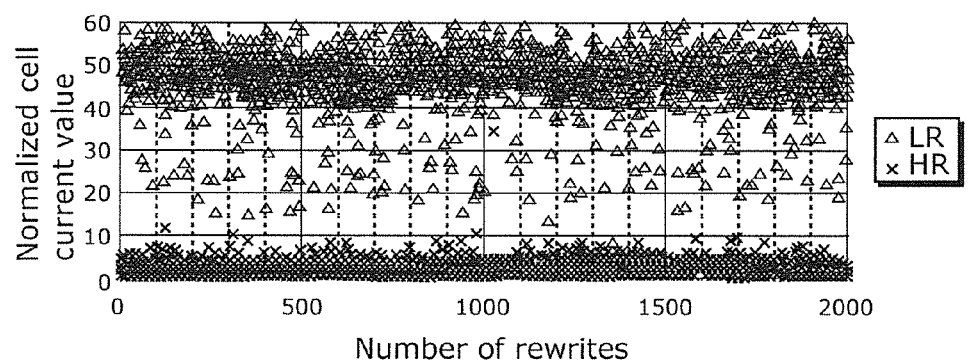
FIG. 10A is a graph plotting normalized cell current values after write operations, in relation to the number of writes for a variable resistance element having inferior characteristics.

FIG. 10A is a graph plotting normalized cell current values in relation to the number of writes for a variable resistance element having inferior characteristics. In FIG. 10A, the horizontal axis indicates the number of writes. The normalized cell current value after LR writing is plotted with Δ, and the normalized cell current value after HR writing is plotted with x. In many cases, the normalized cell current value after HR writing is 10 or less, and the normalized cell current value after LR writing is 40 or greater. However, it can be seen that the normalized cell current value is occasionally set to an intermediate level between 10 and 40.

Figure 10B:
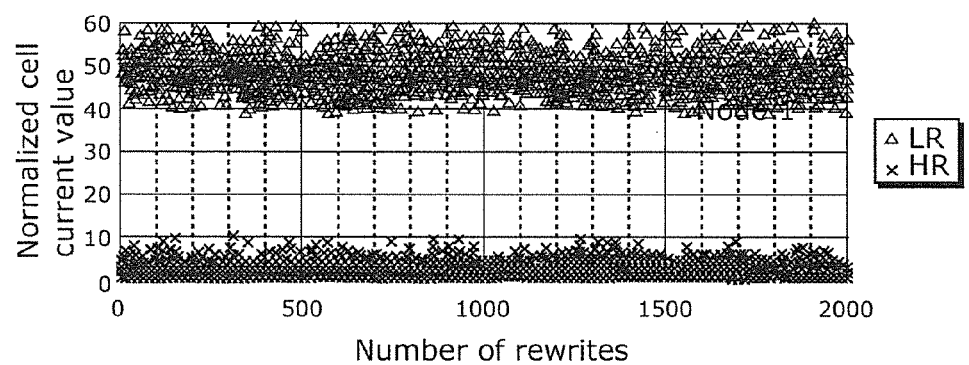
FIG. 10B is a graph plotting normalized cell current values after additional write operations, in relation to the number of writes for the variable resistance element.

On the other hand, FIG. 10B is a graph plotting the normalized cell current value after additional write operations in relation to the number of writes for the variable resistance element. That is to say, in the case of HR writing, when the normalized cell current value is greater than 10 after writing once, additional writing is performed, and in the case of LR writing, when the normalized cell current value is less than 40 after writing once, additional writing is performed, Checking the resistance state after writing in this manner is called "verification", and additional writing after the verification is called additional writing after verification process. Consequently, the normalized cell current value is not set between 10 and 40 in FIG. 10B, thereby ensuring a highly reliable writing state with an assured large detection window.

Next, a case will be described in which the above-mentioned additional writing after verification process is applied to the nonvolatile latch circuit and the nonvolatile flip-flop circuit according to the present invention.

In FIG. 4, Diff terminal which is the output terminal of the comparator circuit 23 is connected to a controller (not illustrated). That is to say, when the transmission gate TMG2 is off, the outputs of the summing amplifier circuit 22 and the inverter circuit 20 are compared to each other, and when the comparison indicates the same logic states (High or Low), Low is inputted to the controller via Diff terminal, whereas when the comparison indicates different logic states, High is inputted to the controller via Diff terminal. Here, description is given according to the flow chart of FIG. 11.

Figure 11:
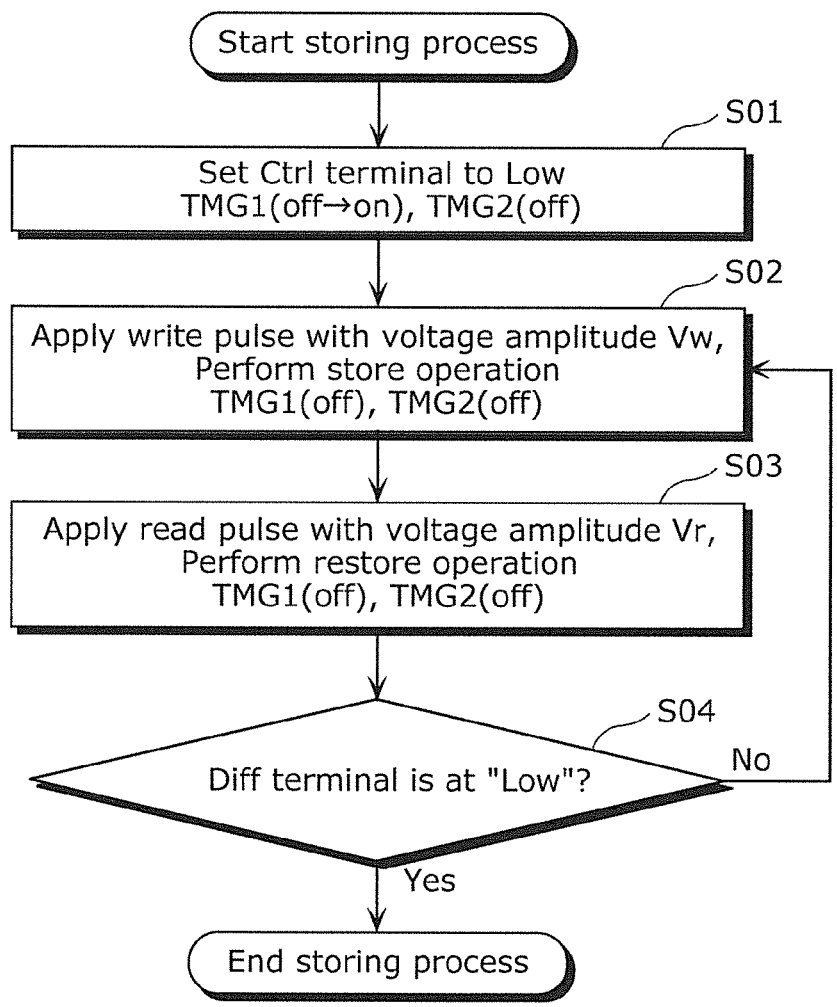
FIG. 11 is a flowchart of a store operation performed by the nonvolatile latch circuit according to Embodiment 1.

FIG. 11 is a flow chart illustrating a storing process of the nonvolatile latch circuit according to Embodiment 1.

First, the controller sets the transmission gates TMG1, TMG2 of the nonvolatile latch circuit 100 off, sets only the transmission gate TMG1 on in a state where Ctrl terminal is set Low (GND level), takes a logic state inputted to the D terminal into the latch circuit, and latches input data (S01).

Subsequently, the controller sets the transmission gates TMG1, TMG2 off, applies a write voltage pulse Vw to Ctrl terminal, and performs a store operation in order to store a latch state in the variable resistance element 1 (S02).

Next, the controller applies a read voltage Vr to Ctrl terminal and reads a resistance state from the variable resistance element 1 with the transmission gates TMG1, TMG2 in OFF state (S03). In response to the resistance state, the summing amplifier circuit 22 outputs High or Low.

In step S02, when a desired writing has been successful, two inputs of the comparator circuit 23 match, and thus the controller receives Low signal via Diff terminal. On the other hand, when two inputs of the comparator circuit 23 do not match, the controller receives High signal. That is to say, when Diff terminal is High (No in step S04), the process returns to step S02 and the store operation is repeated, whereas when Diff terminal is Low (Yes in step S04), the store process is terminated because normal writing has been performed.

That is to say, the above controller corresponds to the first read/write control circuit, and when the summing amplifier circuit 22 does not output to the latch operating unit with the transmission gate TMG2 in OFF state, the controller compares a high-level voltage or a low-level voltage outputted by the summing amplifier circuit 22 with the latch state of the latch operating unit for matching. The controller prohibits a write operation when a result of the comparison indicates matching which shows the equivalence between the resistance state of the variable resistance element 1 and changed resistance state of the variable resistance element 1 after the write operation is performed, the resistance state representing the current logic state of the latch operating unit, and the changed resistance state indicating an output of the summing amplifier circuit 22. The controller permits a write operation when a result of the comparison indicates non matching which shows a difference between the resistance state of the variable resistance element 1 and changed resistance state of the variable resistance element 1 after the write operation is performed, the resistance state representing the current logic state of the latch operating unit, and the changed resistance state indicating an output of the summing amplifier circuit 22.

When the variable resistance element 1 is written as HR by the above-described store process, the variable resistance element 1 is written in a high resistance state so that node 5 becomes reliably High with respect to at least a read determination point (a reference value of read current or the like for determining whether a high resistance state or a low resistance state). Conversely, when the variable resistance element 1 is written as LR, the variable resistance element 1 is written in a low resistance state so that node 5 becomes reliably Low with respect to at least the read determination point. Consequently, a write failure of the variable resistance element described in FIG. 10A is prevented, and thus a highly reliable nonvolatile latch circuit and nonvolatile flip-flop circuit can be provided.

Figure 12:
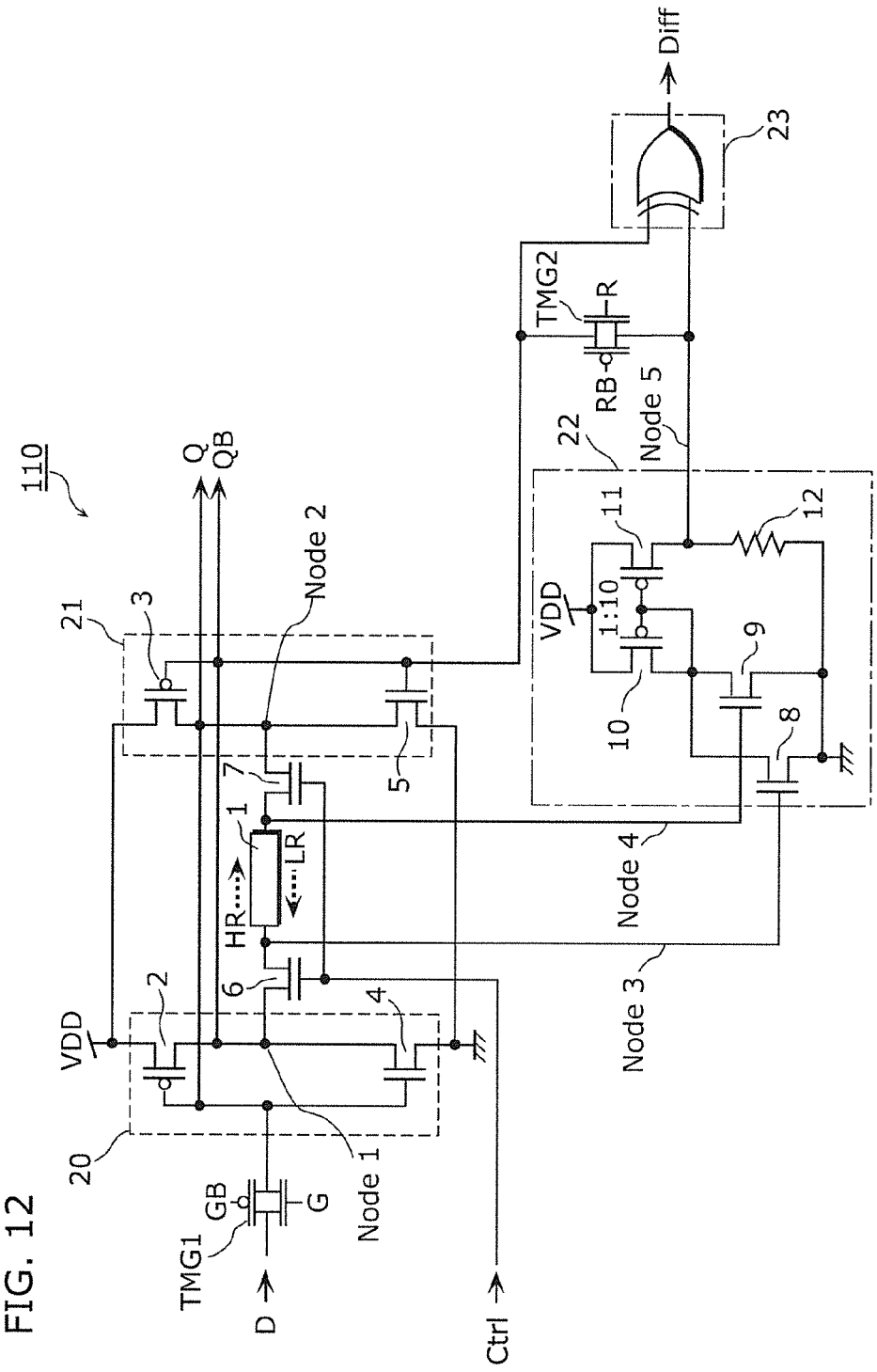
FIG. 12 is a circuit configuration diagram of a nonvolatile latch circuit illustrating a modification of Embodiment 1.

FIG. 12 is a circuit configuration diagram of a nonvolatile latch circuit illustrating a modification of Embodiment 1. The nonvolatile latch circuit 110 illustrated in FIG. 10 differs from the nonvolatile latch circuit 100 of FIG. 3 in that the direction of resistance change of the variable resistance element 1 is different, and accordingly, node 5 is connected to the input of the inverter circuit 21 via the transmission gate TMG2. Specifically, when the variable resistance element 1 performs a store operation with node 1 at High and node 2 at Low, the variable resistance element 1 changes to HR state. Conversely, when the variable resistance element 1 performs a store operation with node 1 at Low and node 2 at High, the variable resistance element 1 changes to LR state. The present configuration also provides the same effect as that provided by the nonvolatile latch circuit 100 illustrated in FIG. 3. That is to say, in any combination of two types of the state of the variable resistance element 1 (HR and LR), and two types of the level of the node 1 of the latch circuit (high level and low level), when the variable resistance element is in HR state, the node 1 (the third node) is restored to a High level, and the node 2 (the fourth node) is restored to a Low level. On the other hand, when the variable resistance element is in LR state, the node 1 (the third node) is restored to a Low level, and the node 2 (the fourth node) is restored to a High level. Accordingly, even when the direction of a resistance change is different from the direction in FIG. 3, the summing amplifier circuit 22 stably restores the logic state of the latch operating unit including the inverter circuits 20 and 21 from the resistance state stored in the variable resistance element 1.

[Embodiment 2]

Next, a nonvolatile latch circuit 200 according to Embodiment 2 of the present invention will be described with reference to FIGS. 13 and 14.

Figure 13:
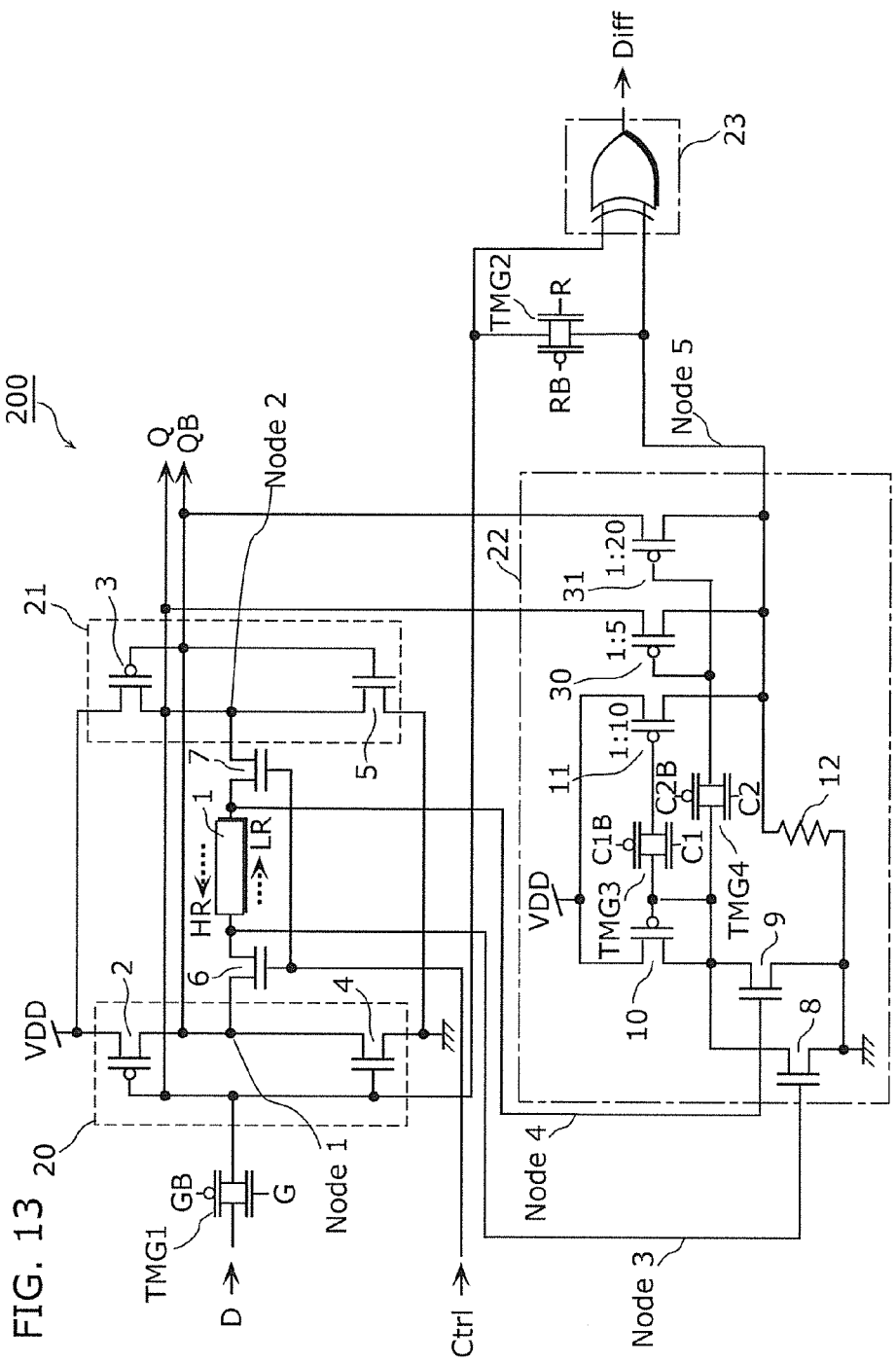
FIG. 13 is a circuit configuration diagram of a nonvolatile latch circuit according to Embodiment 2.

FIG. 13 is a circuit configuration diagram of the nonvolatile latch circuit according to Embodiment 2. In FIG. 13, the components labeled with the same symbols as in FIG. 4 have the same function, and thus description is omitted. The point of difference from FIG. 4 is that the ratio of the gate width with respect to the transistor 10 is changed, and a transistor 30 having an amplification ratio of 1:5, and a transistor 31 having an amplification ratio of 1:20 have been added, and three kinds of amplification ratios of the transistors 11, 30, and 31 can be arbitrarily selected by choosing the transmission gates TMG3 and TMG4.

Figure 14:
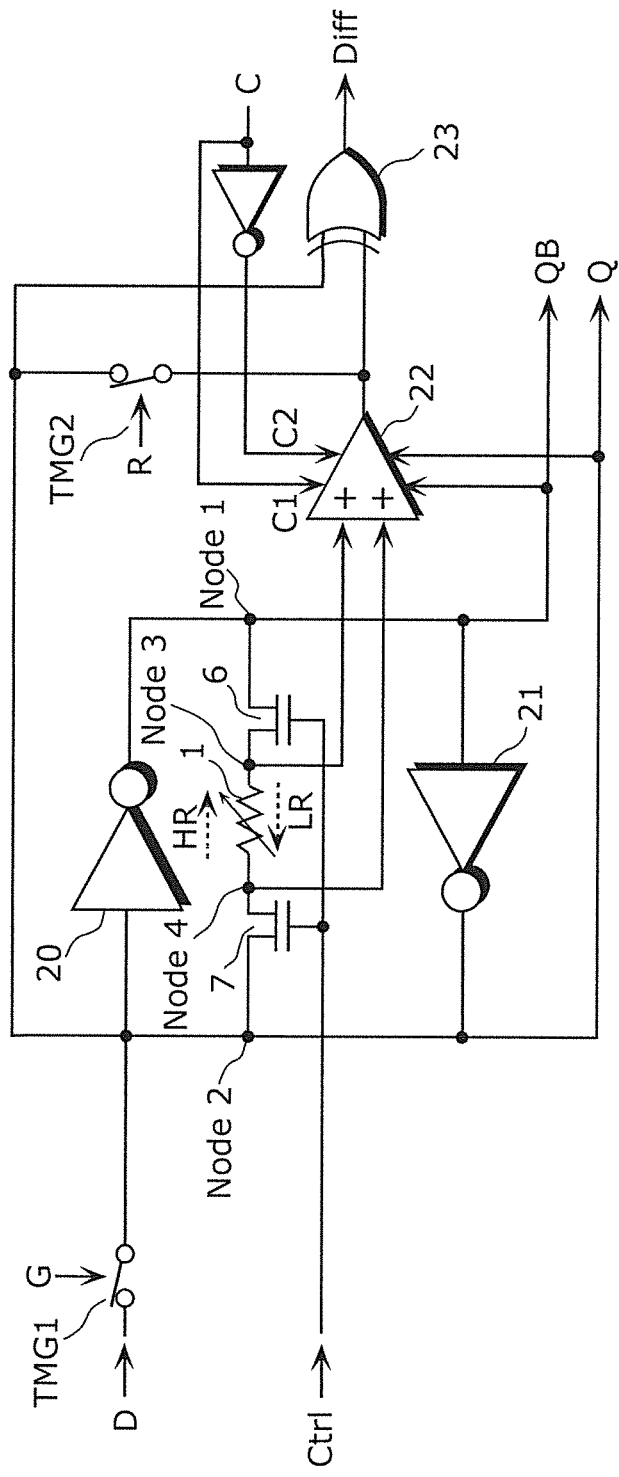
FIG. 14 is a block diagram of the nonvolatile latch circuit according to Embodiment 2.

FIG. 14 is a block configuration diagram of the nonvolatile latch circuit according to Embodiment 2. FIG. 14 is a block diagram for FIG. 13, and the components labeled with the same symbols operate in the same manner. Table 1 shows the correspondence between the amplification ratio of the summing amplifier circuit 22 and each mode.

| | C1 = 1, C2 = 0 | C1 = 0, C2 = 1 |
| --- | --- | --- |
| Q = 1, QB = 0 | GAIN 1:10 | GAIN 1:5 (HR WRITING) |
| Q = 0, QB = 1 | GAIN 1:10 | GAIN 1:20 (LR WRITING) |
| MODE | READ | WRITE |

The listing C1=1, C2=0 in Table 1 indicates read mode in which the transmission gate TMG3 is in ON state, the transmission gate TMG4 is in OFF state, and the above-described transistor 11 is selected to perform a restore process. In this case, a normal ratio of 1:10 is selected as the amplification ratio of the summing amplifier circuit 22. A first read determination point is defined as the determination point such that when the variable resistance element is in HR, node 5 is High, and when the variable resistance element is in LR, node 5 is Low.

In the case of store process with C1=0, C2=1, and Q=1, QB=0, the mode is set as HR write mode, and the transistor 30 is selected. In this case, HR write ratio of 1:5 is selected as the amplification ratio of the summing amplifier circuit 22. In the above case, a second read determination point is set which corresponds to a resistance level even higher than the above-mentioned first read determination point. As described in FIG. 10B, this provides the same effect which is achieved by setting a normalized cell current value of 10 to be the read determination point, and thus a write operation is performed so that the level of HR state which is set with respect to the first read determination point maintains a is predetermined margin.

On the other hand, in the case of store process with C1=0, C2=1, and Q=0, QB=1, the mode is set as LR write mode, and the transistor 31 is selected. In this case, LR write ratio of 1:20 is selected as the amplification ratio of the summing amplifier circuit 22.

In the above case, a third read determination point is set which corresponds to a resistance level even lower than the above-mentioned first read determination point. As described in FIG. 10B, this provides the same effect which is achieved by setting a normalized cell current value of 40 to be the read determination point, and thus a write operation is performed so that the level of LR state which is set with respect to the first read determination point maintains a predetermined margin.

By performing the write process as described above, a predetermined margin is assured with respect to the first read determination point, and writing is performed on the variable resistance element at the resistance level of LR state and HR state. Thus when the nonvolatile latch circuit and the nonvolatile flip-flop circuit, and the nonvolatile signal processing device using those circuits are placed in a high temperature environment, desired data holding characteristics can be assured even when the resistance of the variable resistance element deteriorates.

It is to be noted that the relationship of amplification ratios between the transistor 10, the transistor 11, the transistor 30, and the transistor 31 is not limited to the illustrated relationship of amplification ratios. The characteristics of the present invention is that modified amplification ratios of the summing amplifier circuit 22 are used in normal read in a restore process, and verification read at the time of additional writing after verification in a store process. That is to say, the summing amplifier circuit 22 amplifies summed current with the first amplification ratio (1:10) in the case of normal read in which a high-level voltage or a low-level voltage representing the resistance state of the variable resistance element 1 is outputted to the latch operating unit in order to restore the logic state of the latch operating unit from the variable resistance element 1. On the other hand, the summing amplifier circuit 22 amplifies summed current with the second amplification ratio (1:5 or 1:20) different from the first amplification ratio in the case of verification read in which a high-level voltage or a low-level voltage representing the resistance state of the variable resistance element 1 is outputted to the comparator circuit 23 in order to verify the resistance state before and after a write operation for changing the resistance state of the variable resistance element 1.

Thus, the technique for changing the amplification ratio of the summing amplifier circuit 22 is not limited to the illustrated technique, and various techniques may be used. For example, a plurality of transistors having different gate widths are connected to the transistor 10 and connection may be switched between the transistors by a switch. Alternatively, a plurality of resistance elements 12 with different resistance values may be connected to switch between the resistance elements by a switch, in the present embodiment, when the transmission gates TMG3 and TMG4 are turned off, the gates of the transistor 11 or 30 and 31 may be floated and the operation may become unstable. In this case, it is desirable to pull up the power source voltage VDD. However, this is a design approach based on conventional technology, and thus not illustrated.

[Embodiment 3]

Next, a nonvolatile flip-flop circuit using a nonvolatile latch circuit according to Embodiment 3 of the present invention will be described with reference to FIGS. 15A and 15B.

Figure 15A:
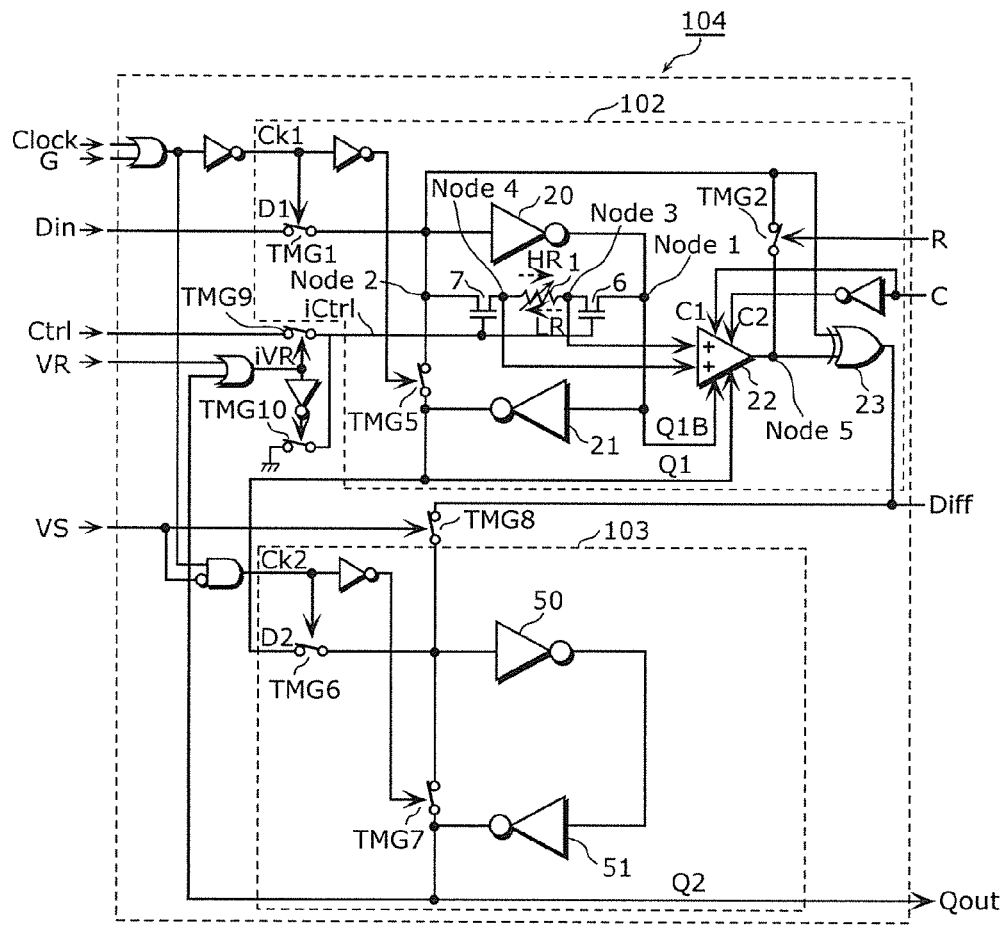
FIG. 15A is a circuit configuration diagram of a nonvolatile D flip-flop circuit according to Embodiment 3.
Figure 15B:
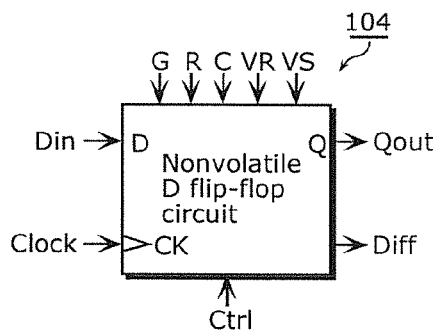
FIG. 15B is a block diagram of the nonvolatile D flip-flop circuit according to Embodiment 3.

FIG. 15A is a circuit configuration diagram of the nonvolatile D flip-flop circuit according to Embodiment 3. FIG. 15B is a block diagram of the nonvolatile D flip-flop circuit according to Embodiment 3. The nonvolatile D flip-flop circuit 104 illustrated in FIG. 15A includes a nonvolatile D latch circuit 102 and a D latch circuit 103. The D latch circuit 103 includes inverter circuits 50 and 51, and transmission gates TMG6 and TMG7. The output of the inverter circuit 50 of the D latch circuit 103 is connected to the input of the inverter circuit 51, and the output of the inverter circuit 51 is connected to the input of the inverter circuit 50 via the transmission gate TMG7. That is to say, when the transmission gate TMG7 is in ON state, the D latch circuit 103 is a latch circuit in which typical inverter circuits are connected in a cross-coupled configuration. D2 terminal of the D latch circuit 103 and the input terminal of the inverter circuit 50 are connected to each other via the transmission gate TMG6. When a control signal inputted to Ck2 terminal of the D latch circuit 103 is High, the transmission gate TMG6 is turned on and the transmission gate TMG7 is turned off. When the control signal is Low, the transmission gate TMG6 is turned off and the transmission gate TMG7 is turned on. Because D latch circuit is a well-known technology which is described in a general textbook, detailed description is omitted, D latch circuit operates so as to latch data inputted to D2 terminal when a clock signal inputted to Ck2 is High.

On the other hand, the components of the nonvolatile D latch circuit 102 that have the same reference symbols as those in the nonvolatile latch circuit illustrated in FIG. 14 operate in the same manner, and thus description is omitted. The point of difference from the nonvolatile latch circuit illustrated in FIG. 14 is that the output of the inverter circuit 21 is connected to the input of the inverter circuit 20 via the transmission gate TMG5, when the control signal inputted to Ck1 terminal is High, the transmission gate TMG1 is turned on and the transmission gate TMG5 is turned off, and when the control signal is Low, the transmission gate TMG1 is turned off and the transmission gate TMG5 is turned on. That is to say, when iCtrl terminal is Low and a signal inputted from R terminal is Low, the transistors 6 and 7 and the transmission gate TMG2 are turned off. The circuit blocks that are involved in the operation are the inverter circuits 20 and 21, and the transmission gates TMG1 and TMG5 only. That is to say, the nonvolatile D latch circuit 102 functions similarly to the D latch circuit 103.

Furthermore, an output Q1 of the nonvolatile D latch circuit 102 is inputted to the input terminal D2 of the D latch circuit 103. A signal obtained by performing AND operation on a first OR signal and the inverted signal of VS terminal is inputted to Ck2 terminal of the D latch circuit 103, the first OR signal being obtained by performing OR operation on Clock signal and control signal G, and the inverted signal of the first OR signal is inputted to Ck1 terminal of the nonvolatile D latch circuit 102. The iCtrl terminal is connected to Ctrl terminal via the transmission gate TMG9, and iCtrl terminal is connected to the ground via the transmission gate TMG10. When iVR signal is High, the transmission gate TMG9 is turned on and the transmission gate TMG10 is turned off, whereas when iVR signal is Low, the transmission gate TMG9 is turned off and the transmission gate TMG10 is turned on, the iVR signal being obtained by OR operation on VR terminal and Q2 which is the output of the D latch circuit 103. The output of the comparator circuit 23 is connected to the input of the inverter circuit 50 via the transmission gate TMG8. When the control signal from VS terminal is High, the transmission gate TMG8 is turned on, whereas when the control signal is Low, the transmission gate TMG8 is turned off.

In such a circuit configuration, when VS terminal is Low (the transmission gate TMG8 is OFF), VR terminal is High (the transmission gate TMG9 is ON and the transmission gate TMG10 OFF), and G terminal is Low, a signal inputted from Clock terminal changes from Low to High, and a signal of Din terminal is inputted to the nonvolatile D latch circuit 102 and the D latch circuit 103, and is transmitted to Qout terminal. That is to say, the state of data latch is updated at a rising edge where Clock signal changes from Low to High, and thus the nonvolatile D flip-flop circuit 104 operates such that an input signal is transmitted to an output terminal. D flip-flop circuit in which D latch circuits are combined is a typical well-known technology, and thus detailed description of the operation of a flip-flop is omitted.

[Restore Operation]

Next, the restore operation of the nonvolatile D flip-flop circuit 104 in the present embodiment will be described, in the nonvolatile D flip-flop circuit 104 of FIG. 15A, VS terminal is fixed to Low and G terminal is fixed to High. Consequently, the transmission gate TMG8 is turned off, Ck1 is set to Low, and Ck2 is set to High, and thus the transmission gate TMG1 is turned off, TMG5 is turned on, TMG6 is turned on, and TMG7 is turned off. In addition, VR terminal is fixed to High, R terminal is fixed to High, C terminal is fixed to High, the transmission gate TMG9 is turned on, TMG10 is turned off, and TMG2 is turned on. When a read voltage is applied from Ctrl terminal in the above-described circuit state, the state of the nonvolatile D latch circuit 102 is restored by the summing amplifier circuit 22 according to the resistance state stored in the variable resistance element 1 as described in Embodiment 1. Subsequently, output Q1 of the nonvolatile D latch circuit 102 is inputted to D2, the state of the inverter circuits 50 and 51 is also determined, and the state of the nonvolatile D flip-flop circuit 104 immediately before a store operation is restored at output Q2 and Qout.

[Store Operation]

Next, the store operation of the nonvolatile D flip-flop circuit 104 in the present embodiment will be described. First, the verification read operation before a store operation will be described. In the nonvolatile D flip-flop circuit 104 of FIG. 15A, VS terminal is fixed to High and G terminal is fixed to High. Accordingly, the transmission gate TMG8 is turned on, Ck1 is set to Low, and Ck2 is set to Low, and thus the transmission gate TMG1 is turned off, TMG5 is turned on, TMG6 is turned off, and TMG7 is turned on. Furthermore, VR terminal is set to High, R terminal is set to Low, the transmission gate TMG9 is turned on, TMG10 is turned off, and TMG2 is turned off. C terminal then is fixed to Low, and the amplification ratio of the summing amplifier circuit 22 in the nonvolatile D latch circuit 102 is set for the read determination point for writing (the second or third read determination point) as described in Embodiment 2. In the above-described circuit state, when a read voltage is applied from Ctrl terminal, and when the resistance state stored in the variable resistance element 1 is HR state, High is outputted to the node 5 by the summing amplifier circuit 22, whereas when the resistance state stored in the variable resistance element 1 is LR state, Low is outputted to node 5 by the summing amplifier circuit 22 as described in Embodiment 2. When the latch state of the latch circuit including the inverter circuit 20 and the inverter circuit 21 is such that node 2 is in High state and node 1 is in Low state, a store operation at this moment writes HR to the variable resistance element 1. This is called "latch state for HR writing", and writing is not necessary for a variable resistance element 1 in which node 5 is found to be High by the above-described verification read operation before a store operation. Similarly, when the latch state of the latch circuit including the inverter circuit 20 and the inverter circuit 21 is such that node 2 is in Low state and node 1 is in High state, a store operation at this moment writes LR to the variable resistance element 1. This is called "latch state for LR writing", and writing is not necessary for a variable resistance element 1 in which node 5 is found to be Low by the above-described verification read operation before a store operation. When node 5 is High in the "latch state for HR writing", both inputs of the comparator circuit 23 are equally High, and the output is Low. Similarly, when node 5 is Low in the "latch state for LR writing", both inputs of the comparator circuit 23 are equally Low, and the output is Low. Then Diff signal, which is the output of the comparator circuit 23, is inputted to the inverter circuit 50 via the transmission gate TMG8, and is latched by the D latch circuit 103, and the inverter circuit 51 also outputs Low. Subsequently, VR terminal is set from High to Low before a store operation is performed. At this moment, Q2 signal, which is the output of the inverter circuit 51, is also Low, and thus iVR is set to Low, the transmission gate TMG10 is turned on, and the transmission gate TMG9 is turned off. In the above state, even when a write pulse is inputted from Ctrl terminal, iCtrl node is fixed to Low, and writing is not performed on the variable resistance element 1. That is to say, when the resistance state of the variable resistance element is already same as the target resistance state for writing, a write operation is not performed. Consequently, unnecessary additional writing is prevented, stress to the element can be reduced, the life of the element can be increased, and a problem in which normal resistance change cannot be made is also prevented, the problem being caused by an excessive shift to high resistance or low resistance due to writing in the same direction multiple times Next, the case will be described where the resistance state of the variable resistance element 1 differs from the target resistance state for writing. As described above, when node 5 is Low in the "latch state for HR writing", the inputs of the comparator circuit 23 are different and the output is High. Similarly, when node 5 is High in the "latch state for LR writing", the inputs of the comparator circuit 23 are different and the output is High. Then Diff signal, which is the output of the comparator circuit 23, is inputted to the inverter circuit 50 via the transmission gate TMG8, and is latched by the D latch circuit 103, and the inverter circuit 51 also outputs High. Subsequently, VR terminal is set from High to Low before a store operation is performed. At this moment, Q2 signal, which is the output of the inverter circuit 51, is High, and thus iVR is set to High, the transmission gate TMG10 is turned off, and the transmission gate TMG9 is turned on. In the above state, when a write pulse is inputted from Ctrl terminal, writing is performed on the variable resistance element 1 accordingly. The write operation is the same as that of Embodiment 1, and thus description is omitted.

In FIG. 15A, Diff terminal, which is the output of the comparator circuit 23, is connected to a controller (not illustrated). That is to say, the above controller is the second or third read/write control circuit which controls the gate voltage of the transistors 6 and 7 based on the output of the D latch circuit 103 which latches the output of the comparator circuit 23.

In this manner, a read operation and a write operation are alternately performed before a store operation, and thus additional writing is performed on the variable resistance element 1 so as to achieve a desired resistance level, and the controller functions such that a write operation is automatically prohibited when the target resistance level is achieved. This is significantly effective for controlling a plurality of store operations at the same time in the case where a nonvolatile digital circuit is formed using the nonvolatile D flip-flop circuit 104 according to the present embodiment. A specific example in this case will be described in Embodiment 4.

In the present embodiment, the nonvolatile D flip-flop circuit 104 has been illustrated which uses the variable resistance element 1 in the D flip-flop circuit including two D latch circuits, however, the invention is not limited to this. Embodiment 3 has significant characteristic function that a normal write operation is followed by automatic disabling of a signal input of a write pulse. In order to implement the function, a latch circuit may be provided which holds a result of whether a write operation is normal or abnormal. In the specific example of the present embodiment, the latch circuit is also used as the latch circuit in the next stage of the D type flip-flop, and thus an increase in the number of circuits is prevented. Thus, when restriction is not applied to the attributes of a circuit or a device in particular, the invention is not limited to the above configuration.

[Embodiment 4]

Embodiment 4 of the present invention will be described with reference to FIG. 16.

Figure 16:
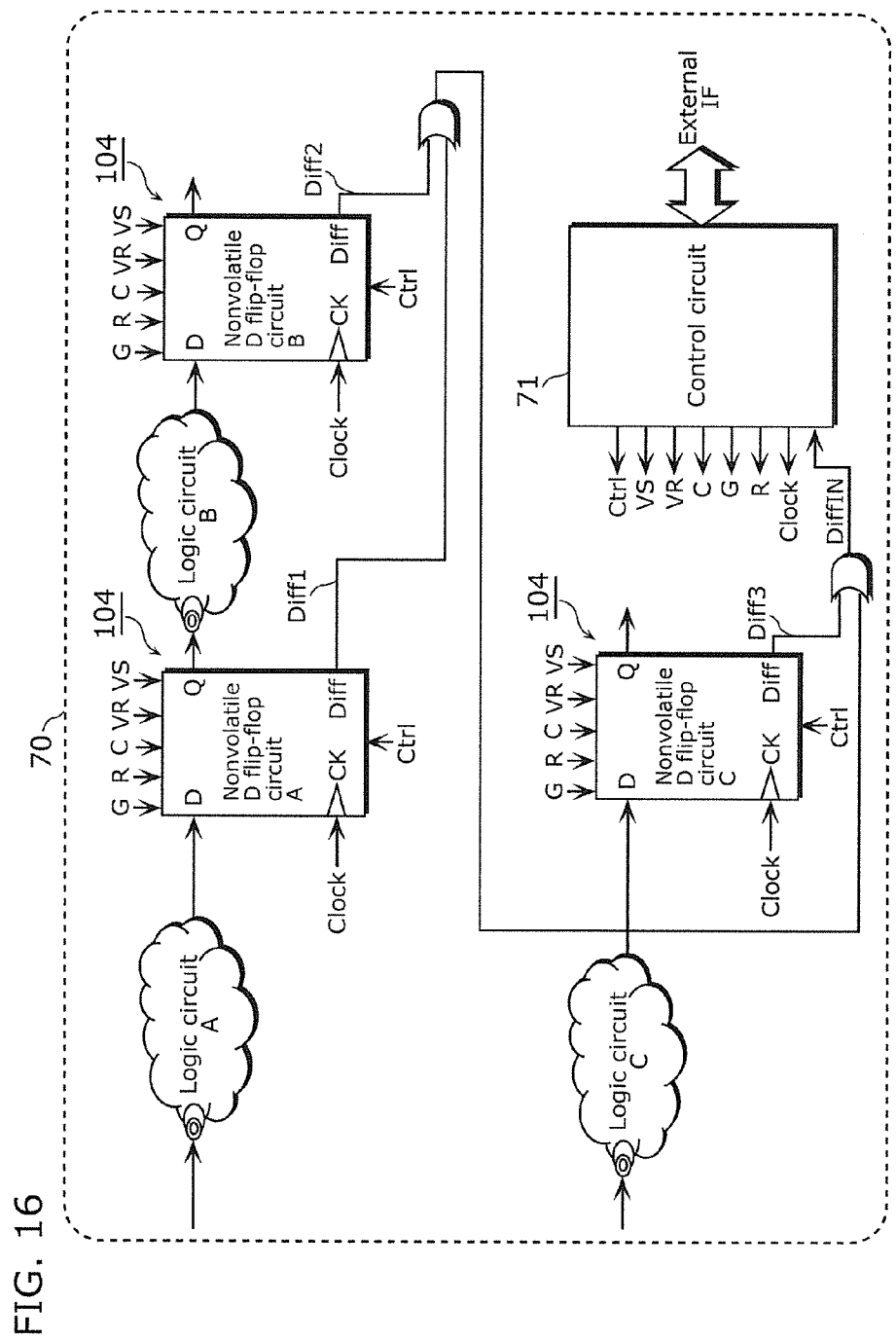
FIG. 16 is a block diagram illustrating a configuration example of a nonvolatile signal processing device according to Embodiment 4.
Figure 17A:
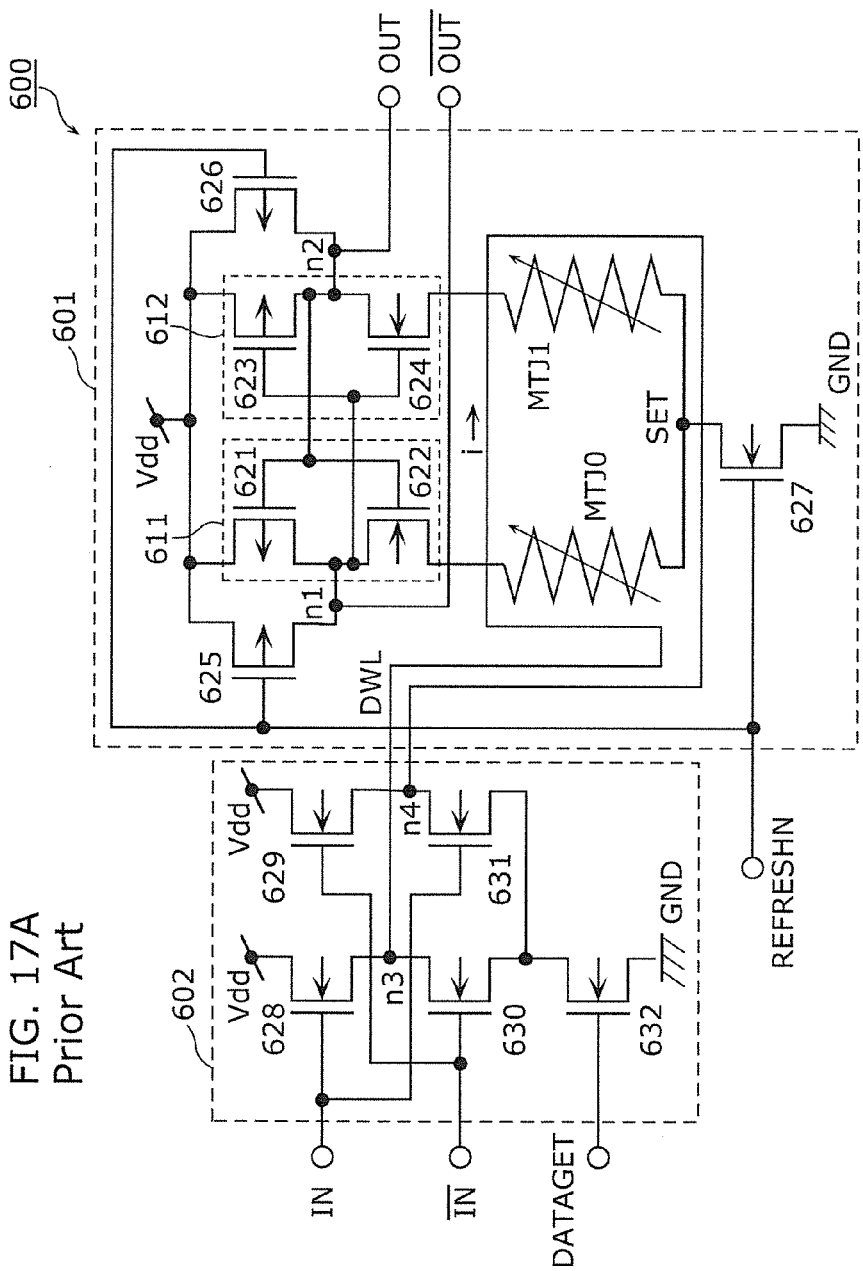
FIG. 17A is a circuit configuration diagram of a nonvolatile latch circuit according to a first conventional embodiment.
Figure 17B:
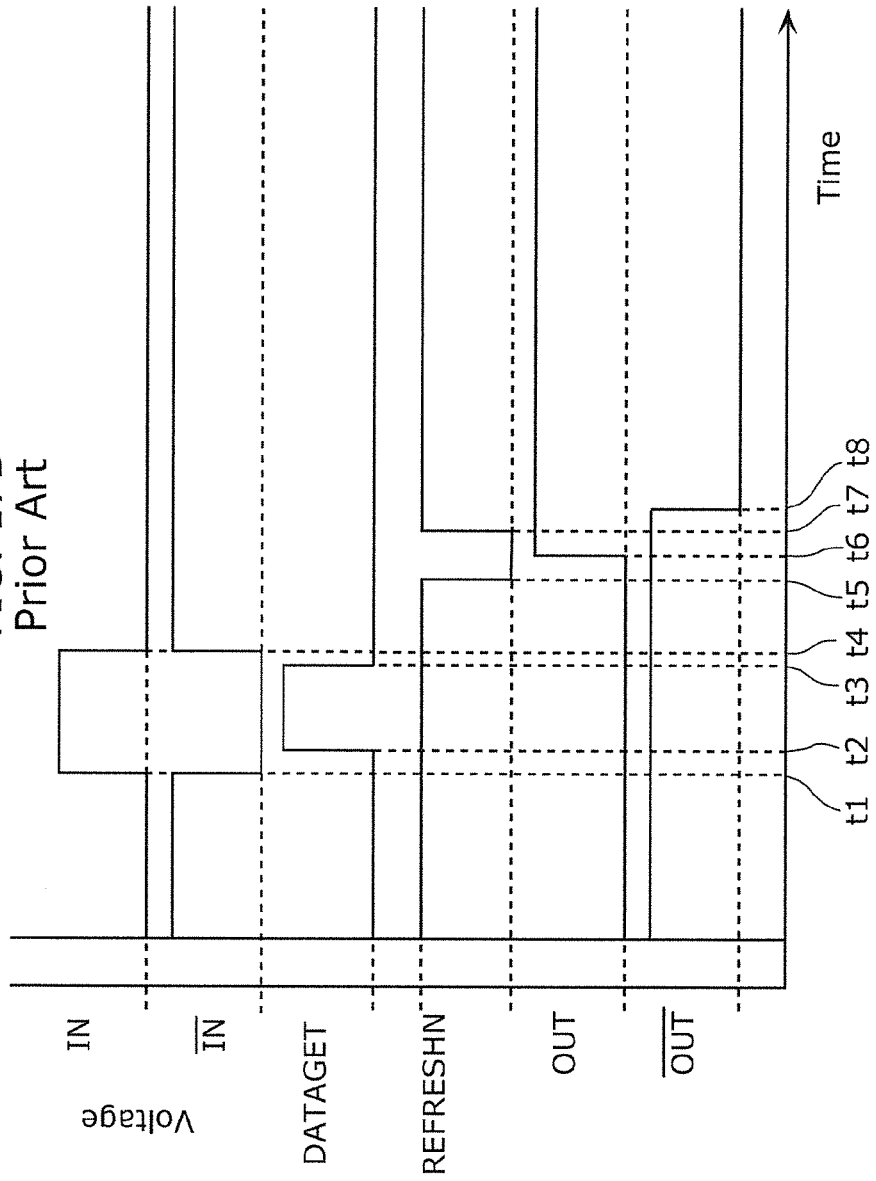
FIG. 17B is an operation timing chart of the nonvolatile latch circuit according to the first conventional embodiment.
Figure 18:
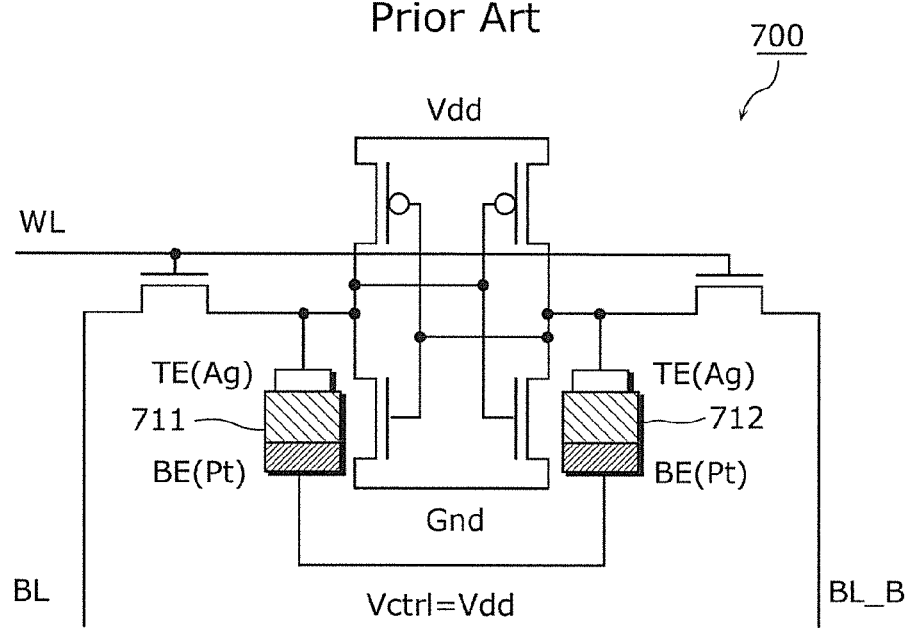
FIG. 18 is a circuit configuration diagram of a nonvolatile latch circuit according to a second conventional embodiment.
Figure 19:
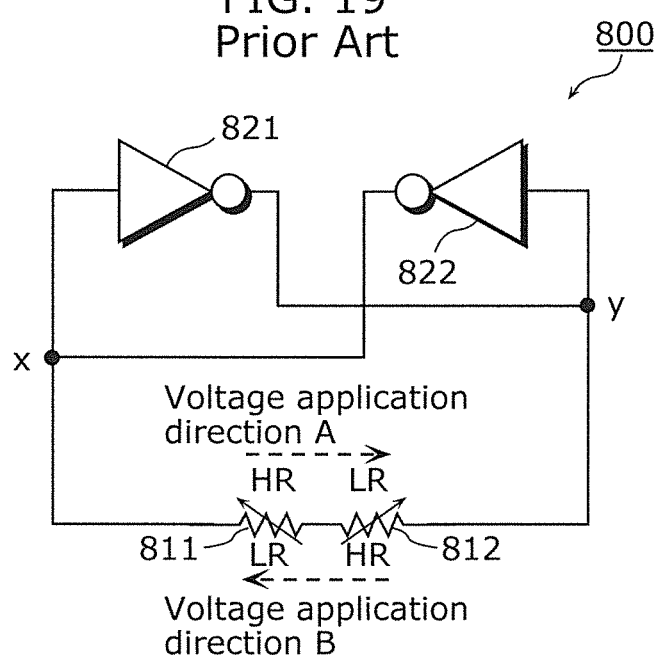
FIG. 19 is a schematic circuit configuration diagram illustrating a method of storing the state of a latch circuit according to a third conventional embodiment into a variable resistance element.
Figure 20:
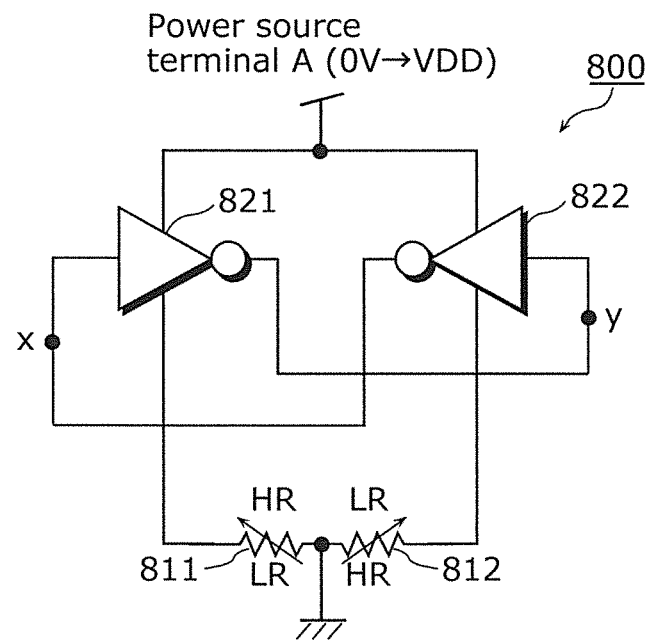
FIG. 20 is a circuit configuration diagram illustrating a method of restoring the previous latch state based on a resistance state stored in the variable resistance element in the latch circuit according to the third conventional embodiment.

FIG. 16 is a block configuration diagram illustrating a configuration example of a nonvolatile signal processing device 1 according to Embodiment 4. The nonvolatile D flip-flop circuit 104 illustrated in FIG. 16 has the same configuration as that of the nonvolatile D flip-flop circuit 104 illustrated in FIG. 15B in Embodiment 3, and thus detailed description is omitted. A nonvolatile signal processing device 70 illustrated in FIG. 16 indicates a configuration of general digital signal processing, which includes combinational logic circuits A to C, and in which the outputs of the combinational logic circuits are latched by nonvolatile D flip-flop circuits A to C, respectively. When normal signal processing is performed, the nonvolatile D flip-flop circuits A to C are operated in the above-described latch mode, and the signal processing for clock synchronization is performed by inputting a clock signal to Clock terminal.

Signals of G, R, C, VR, VS, and Ctrl are sent from the control circuit 71 to all the nonvolatile D flip-flop circuits, and store operations and restore operations can be performed simultaneously on all the nonvolatile D flip-flop circuits as described above. The method of controlling each signal in the store operation and the restore operation is the same as what has been described in Embodiments 1 to 3, and thus detailed description is omitted.

The characteristics of the present embodiment is the store process which stores the latch state of each nonvolatile D flip-flop circuit to the variable resistance element 1. As already described, a write failure as illustrated in FIG. 10A occurs in rare cases in writing to the variable resistance element 1. On the other hand, in the nonvolatile signal processing device 70 which uses a plurality of nonvolatile D flip-flop circuits as illustrated in FIG. 16, even a single write failure in one of the circuits prevents a device state before a store operation from being restored correctly, and thus continuity of signal processing is not maintained. That is to say, desired operation of the nonvolatile signal processor is not assured. In FIG. 16, DiffIN, which is a signal obtained by performing OR operation on an output signal Diff1 at Diff terminal of the nonvolatile D flip-flop circuit A, an output signal Diff2 at Diff terminal of the nonvolatile D flip prop circuit B, and an output signal Diff3 at Diff terminal of the nonvolatile D flip-flop circuit C, is inputted to the control circuit 71. As described in Embodiment 3, when a read operation for verification after a normal write operation is performed, Low is outputted to Diff terminal, whereas when a write operation with a failure is performed, High is outputted to Diff terminal. That is to say, when normal writing is successfully performed on all the nonvolatile D flip prop circuits, DiffIN is set to Low and the control circuit 71 terminates the store operation. On the other hand, a write operation and a read operation for verification are repeated as long as DiffIN is High. In the above step, in the order of completion of a normal write operation in the nonvolatile D flip-flop circuits, a write pulse inputted from corresponding Ctrl terminal is blocked, and thus unnecessary writing is not performed. That is to say, the control circuit 71 combines the output signals of the respective comparator circuits 23 included in the above-mentioned three nonvolatile D flip-flop circuits, and monitors completion of a normal write operation on each of all the variable resistance elements 1 included in the three nonvolatile D flip-flop circuits, and controls a write operation to the variable resistance element 1 and a read operation from the variable resistance element 1 for each of the three nonvolatile D flip-flop circuits.

As described above, in the configuration of the nonvolatile signal processing device 70 which uses the nonvolatile D flip-flop circuit according to the present invention, write operations for the variable resistance elements 1 included in the nonvolatile D flip-flop circuits A to C are performed while verifying whether or not each write operation is completed normally. Thus, a store operation is not terminated with a write failure, and thus the latch state of a desired flip-flop can be reliably stored. In addition, in the order of completion of a normal write operation in the nonvolatile D flip-flop circuits, a write pulse is automatically blocked, and thus various control signals from the control circuit 71 can be made common for all nonvolatile D flip-flop circuits and the number of wires for wiring can be reduced as much as possible. This provides an advantage in that redundant area other than the signal processing circuits serving the original function of the device can be reduced.

So far, the nonvolatile latch circuit, the nonvolatile flip-flop circuit, and the nonvolatile signal processing device according to the present invention have been described based on Embodiments 1 to 4, however, the nonvolatile latch circuit, the nonvolatile flip-flop circuit, and the nonvolatile signal processing device according to the present invention are not limited to the above-described Embodiments 1 to 4. In a scope not departing from the gist of the present invention, Embodiments 1 to 4 to which various changes that occur to those skilled in the art are made, and various devices which include the nonvolatile latch circuit, the nonvolatile flip-flop circuit, and the nonvolatile signal processing device according to the present invention are also included in the scope of the present invention.

The first read/write control circuit described in Embodiment 1, and the second and third read/write control circuits described in Embodiment 2 may be incorporated in the same control circuit, or the control circuit 71 described in Embodiment 4 may include the first read/write control circuit, and the second and third read/write control circuits.

In each of the above-described embodiments, an oxide layer, which forms a variable resistance layer, comprises stacked tantalum oxide layers, however, as described in Embodiment 1, an oxide layer may comprise stacked hafnium (Hf) oxide layers or stacked zirconium (Zr) oxide layers, for example.

In the case where a stacked structure of hafnium oxide layers is used, under the assumption that a first hafnium oxide has a composition expressed as $HfO_x$ and a second hafnium oxide has a composition expressed as $HfO_y$, respective compositions may approximately satisfy $0.9 \leq x \leq 1.6$, and $1.8 < y < 2.0$, and the thickness of the second hafnium oxide may be 3 nm or greater and 4 nm or less.

In the case where a stacked structure of zirconium oxide layers is used, under the assumption that a first zirconium oxide has a composition expressed as $ZrO_x$ and a second zirconium oxide has a composition expressed as $ZrO_y$, respective compositions may approximately satisfy $0.9 \leq x \leq 1.4$, and $1.9 < y < 2.0$, and the thickness of the second zirconium oxide may be 1 nm or greater and 5 nm or less.

As an oxide layer comprising a metal material, metal oxide layer such as tantalum oxide layer may be included, which is the main variable resistance layer causing a resistance change. In addition, a small quantity of other elements may be included, for example. A small quantity of other elements can be intentionally included by fine adjustment of a resistance value. The above case is also included in the scope of the present invention. For example, the resistance value of the variable resistance layer is increased by adding nitrogen thereto, thus the reactivity of the resistance change can be improved.

[Industrial Applicability]

The nonvolatile latch circuit, the nonvolatile flip-flop circuit, and the nonvolatile signal processing device of the present invention can be applied to a nonvolatile system LSI, CPU, microprocessor, and electronic products for which the capability of fully restoring an operational state immediately before the power source is turned off is demanded, and thus is useful in industry.

[Reference Signs List]

| | |
|---|---|
| 1, 500, 711, 712, 811, 812 | Variable resistance element |
| 2, 3, 4, 5, 6, 7, 8, 9, 10, 11, 30, 31 | Transistor |
| 12 | Resistance element |
| 20, 21, 50, 51, 611, 612, 821, 822 | Inverter circuit |
| 22 | Summing amplifier circuit |
| 23 | Comparator circuit |
| 70 | Nonvolatile signal processing device |
| 71 | Control circuit |
| 100, 110, 200, 600, 700, 800 | Nonvolatile latch circuit |
| 102 | Nonvolatile D latch circuit |
| 103 | D latch circuit |
| 104 | Nonvolatile D flip-flop circuit |
| 501 | First electrode Layer |
| 502 | First variable resistance layer |
| 503 | Second variable resistance layer |
| 504 | Second electrode layer |
| 505 | Gate having gate oxide film layer |
| 506 | Source-drain region |
| 507 | Plug layer |
| 508 | Metal wiring layer |
| 601 | Sense latch circuit |
| 602 | Write current generation circuit |
| 621, 623, 625, 626 | P-type MOSFET |
| 622, 624, 627, 628, 629, 630, 631, 632 | N-type MOSFET |
| TMG1, TMG2, TMG3, TMG4, TMG5, TMG6, TMG7, TMG8, TMG9, TMG10 | Transmission gate |

The invention claimed is:

1. A nonvolatile latch circuit comprising:
a latch operating unit including a first logic inversion circuit, and a second logic inversion circuit having an input terminal connected to an output terminal of the first logic inversion circuit and an output terminal connected to an input terminal of the first logic inversion circuit;
a first transistor which includes a first terminal, a second terminal, and a first control terminal, and controls a conduction state between the first terminal and the second terminal in accordance with a voltage of the first control terminal;
a second transistor which includes a third terminal, a fourth terminal, and a second control terminal, and controls a conduction state between the third terminal and the fourth terminal in accordance with a voltage of the second control terminal; and
a variable resistance element having a structure in which an oxide layer comprising a metal oxide is interposed between first and second electrodes,
wherein the first terminal of the first transistor and the first electrode of the variable resistance element are connected to each other via a first node, and the fourth terminal of the second transistor and the second electrode of the variable resistance element are connected to each other via a second node,
the output terminal of the first logic inversion circuit and the second terminal of the first transistor are connected to each other via a third node, and the output terminal of the second logic inversion circuit and the third terminal of the second transistor are connected to each other via a fourth node,
the variable resistance element changes to a first resistance state under application of a first write voltage higher than a first predetermined voltage, between the first electrode and the second electrode so as to cause a current to flow in a direction from the first electrode to the second electrode, and changes to a second resistance state which is higher in resistance value than the first resistance state under application of a second write voltage higher than a second predetermined voltage, between the first electrode and the second electrode so as to cause a current to flow in a direction from the second electrode to the first electrode, and
the nonvolatile latch circuit further comprises:
a summing amplifier circuit which outputs a high-level voltage or a low-level voltage to the latch operating unit according to a value of sum of a potential at the first node and a potential at the second node so as to restore a logic state of the latch operating unit, the potentials being obtained by application of a voltage lower in absolute value than the first voltage and the second voltage to the first control terminal and the second control terminal, and the high-level voltage or the low-level voltage representing a resistance state of the variable resistance element; and
a comparator circuit which outputs a high-level voltage or a low-level voltage based on a result of comparison for matching between an output of the summing amplifier circuit and an output of the first logic inversion circuit or the second logic inversion circuit when the summing amplifier circuit does not output the high-level voltage or the low-level voltage to the latch operating unit.

2. The nonvolatile latch circuit according to claim 1, further comprising
a first read/write control circuit which
(i) prohibits writing when the result of comparison by the comparator circuit indicates matching which shows that the resistance state of the variable resistance element and a changed resistance state of the variable resistance element after writing match, the resistance state representing a current logic state of the latch operating unit and the changed resistance state being an output of the summing amplifier circuit, and
(ii) permits writing when the result of comparison by the comparator circuit indicates non matching which shows that the resistance state of the variable resistance element and the changed resistance state of the variable resistance element after writing do not match, the resistance state representing a current logic state of the latch operating unit and the changed resistance state being an output of the summing amplifier circuit.

3. The nonvolatile latch circuit according to claim 1,
wherein the summing amplifier circuit amplifies the value of sum, and outputs a high-level voltage or a low-level voltage which represents the resistance state of the variable resistance element,
amplifies the value of sum with a first amplification ratio in the case of normal read where a high-level voltage or a low-level voltage representing the resistance state of the variable resistance element is outputted to the latch operating unit to restore the logic state of the latch operating unit from the variable resistance element, and amplifies the value of sum with a second amplification ratio which is different from the first amplification ratio in the case of verification read where a high-level voltage or a low-level voltage representing the resistance state of the variable resistance element is outputted to the comparator circuit to verify the resistance state of the variable resistance element before and after a write operation for changing the resistance state.

4. The nonvolatile latch circuit according to claim 1, wherein the oxide layer includes a stacked structure of a first oxide layer comprising a first metal and a second oxide layer comprising a second metal, a degree of oxygen deficiency of the first oxide layer is greater than a degree of oxygen deficiency of the second oxide layer, the second electrode is in contact with the second oxide layer, and the first electrode is in contact with the first oxide layer.

5. The nonvolatile latch circuit according to claim 4, wherein the first oxide layer is a first tantalum oxide layer having a composition expressed by $TaO_x$ where $0<x<2.5$.

6. The nonvolatile latch circuit according to claim 5, wherein the second oxide layer is a second tantalum oxide layer having a composition expressed by $TaO_y$ where $x<y$.

7. The nonvolatile latch circuit according to claim 1, wherein a material of the second electrode is higher in standard electrode potential than a material of the first electrode.

8. The nonvolatile latch circuit according to claim 1, further comprising:

a latch circuit which latches an output of the comparator circuit; and a second read/write control circuit which controls a voltage to be applied to the first control terminal and the second control terminal according to the output of the latch circuit.

9. A nonvolatile flip-flop circuit which is a clock trigger nonvolatile flip-flop circuit, the nonvolatile flip-flop circuit comprising:

a first latch circuit which is the nonvolatile latch circuit according to claim 1;

a second latch circuit which is connected to the first latch circuit in series, and has both functions of latching an input signal and latching the output signal of the comparator circuit; and a third read/write control circuit which controls writing to the first latch circuit according to a latch signal which is a latched output from the comparator circuit.

10. A nonvolatile signal processing device comprising:

N (N is a natural number greater than or equal to 2) pieces of the nonvolatile flip-flop circuits according to claim 9; and a control circuit which combines output signals of the comparator circuits respectively included in the N pieces of the nonvolatile flip-flop circuits, monitors normal completion of write operations to all the variable resistance elements included in the N pieces of the nonvolatile flip-flop circuits, and controls write operations to the variable resistance elements and read operations from the variable resistance elements for the N pieces of the nonvolatile flip-flop circuits.

* * * * *